(12) United States Patent
Takahashi et al.

(10) Patent No.: US 7,709,925 B2
(45) Date of Patent: May 4, 2010

(54) SEMICONDUCTOR DEVICE

(75) Inventors: Tetsuo Takahashi, Tokyo (JP);
Tomohide Terashima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 572 days.

(21) Appl. No.: 11/622,670

(22) Filed: Jan. 12, 2007

(65) Prior Publication Data
US 2007/0176220 A1 Aug. 2, 2007

(30) Foreign Application Priority Data
Jan. 27, 2006 (JP) ............................. 2006-018594

(51) Int. Cl.
*H01L 29/00* (2006.01)
*H03B 1/00* (2006.01)

(52) U.S. Cl. ................ 257/505; 257/370; 257/371; 257/491; 257/504; 257/506; 257/548; 257/E21.544; 257/E21.628; 257/E29.019

(58) Field of Classification Search ............. 257/370, 257/371, 491, 492, 504, 505, 520, 548, E21.544, 257/E21.572, E29.019
See application file for complete search history.

(56) References Cited

U.S. PATENT DOCUMENTS
6,642,583 B2    11/2003    Jimbo et al.

2004/0189353 A1 *   9/2004   Hatade et al. ............... 327/112
2004/0232522 A1    11/2004   Shimizu
2006/0226474 A1 *  10/2006   Ho et al. ..................... 257/326

FOREIGN PATENT DOCUMENTS

| JP | 63-278326   | 11/1988 |
| JP | 5-129426    | 5/1993  |
| JP | 2004-6555   | 1/2004  |
| JP | 2004-349296 | 12/2004 |

OTHER PUBLICATIONS

C Cini, et al., "Intelligent Power Technology: A reality in the 1990s", Proceedings of 1988 International Symposium on Power Semiconductor Devices, Tokyo, 1998, pp. 88-95.
Tomohide Terashirna, et al., "Over 1000V n-ch LDMOSFET and p-ch LIGBT with JI RESURF Structure and Multiple Floating Field Plate", Proceedings of 1995 International Symposium on Power Semiconductor Devices & ICs, Yokohama, 1995, pp. 455-459.

* cited by examiner

*Primary Examiner*—Dao H Nguyen
(74) *Attorney, Agent, or Firm*—Oblon, Spivak, McClelland, Maier & Neustadt, L.L.P.

(57) ABSTRACT

A semiconductor device, including: a semiconductor substrate of a first conductivity type; a semiconductor layer of a second conductivity type formed on the semiconductor substrate; a trench formed in the semiconductor region; a trench diffusion layer of the first conductivity type formed along wall surfaces of the trench; and a buried conductor buried in the trench, wherein an insulation film is further disposed between the wall surfaces of the trench and the buried conductor.

16 Claims, 20 Drawing Sheets

SEMICONDUCTOR DEVICE

CROSS-REFERENCE TO RELATED APPLICATION

The disclosure of Japanese Patent Application No. 2006-18594 filed on Jan. 27, 2006 including specification, drawings and claims is incorporated herein by reference in its entirely.

BACKGROUND OF THE INVENTION

1. Field of the Invention

The present invention relates to a semiconductor device, and more particularly, to a semiconductor device having a trench isolation structure.

2. Description of the Related Art

A semiconductor integrated circuit uses a trench isolation structure as shown in FIG. 20 for example, for isolating multiple semiconductor elements from each other.

A semiconductor device generally denoted at 2000 includes a $p^-$ substrate 1. The $p^-$ substrate 1 seats an $n^-$ layer 2 in which a trench 3 is formed which reaches the $p^-$ substrate 1. A $p^+$ region 5 is formed in wall surfaces of the trench 3, and a buried electrode 31 is disposed in the $p^+$ region 5. Further, there is an $n^+$ buried layer 4 disposed between the $p^-$ substrate 1 and the $n^-$ layer 2. The back surface of the $p^-$ substrate 1 seats a back electrode 15 (JPB 2004-6555).

SUMMARY OF THE INVENTION

This trench structure 3 is a structure in which the buried electrode 31 is buried directly in the trench 3. This develops stress and a leak current due to the different coefficients of thermal expansion of the material of the $p^-$ substrate 1 and the $n^-$ layer 2 (which may be silicon for instance) and the material of the buried electrode 31 (which may be poly-silicon for example), which deteriorates an element characteristic.

Accordingly, an object of the present invention is to provide a semiconductor device in which an isolation structure can be formed within a small occupation space and which has such a trench structure which realizes an excellent element characteristic.

The present invention is directed to a semiconductor device, including: a semiconductor substrate of a first conductivity type; a semiconductor layer of a second conductivity type formed on the semiconductor substrate; a trench formed in the semiconductor region; a trench diffusion layer of the first conductivity type formed along wall surfaces of the trench; and a buried conductor buried in the trench, wherein an insulation film is further disposed between the wall surfaces of the trench and the buried conductor.

As described clearly above, the semiconductor device according to the present invention has a compact size and a high level of circuit integration and exhibits an excellent semiconductor element characteristic.

DETAILED DESCRIPTION OF THE PREFERRED EMBODIMENTS

First Embodiment

Figure 1A:
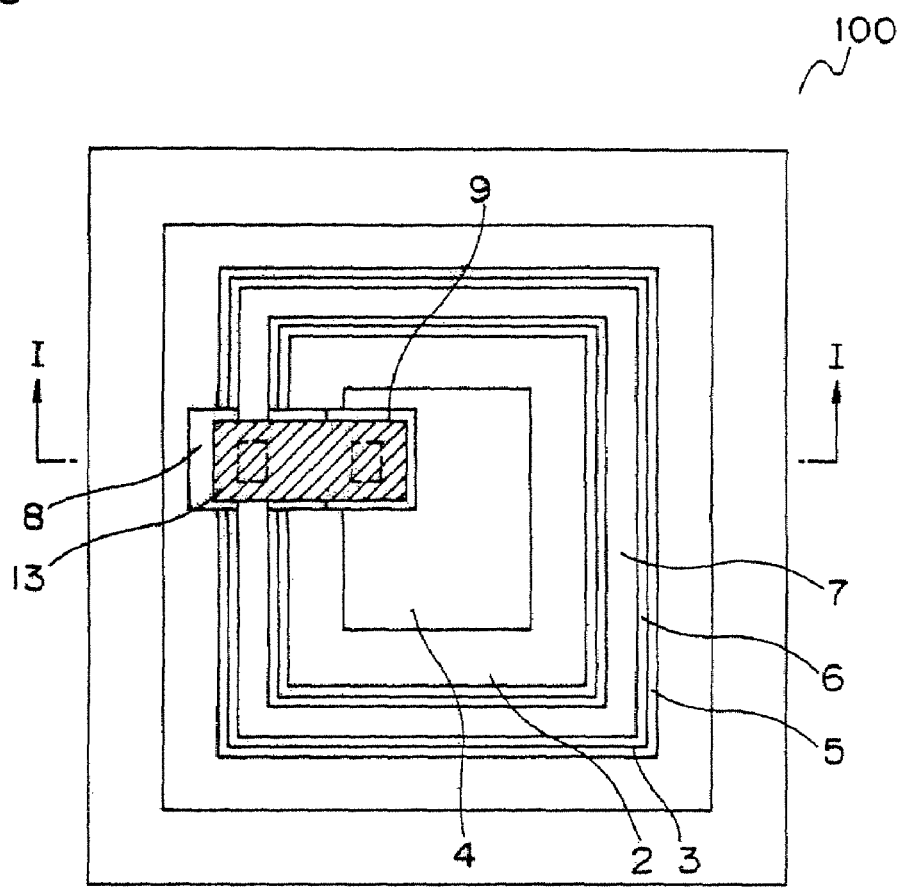
FIG. 1A shows a top view of a semiconductor device according to a first embodiment of the present invention.
Figure 1B:
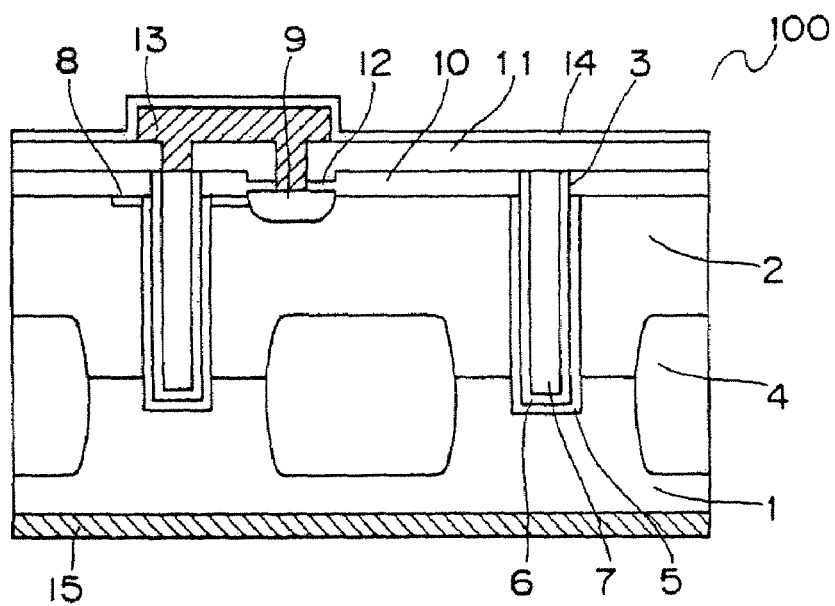
FIG. 1B shows a cross sectional view of a semiconductor device according to a first embodiment of the present invention.

FIGS. 1A and 1B show a semiconductor device according to the first embodiment of the present invention generally denoted at 100. FIG. 1A is a top view, and FIG. 1B is a cross sectional view taken along the direction I-I in FIG. 1A.

As shown in FIGS. 1A and 1B, the semiconductor device 100 includes a p-type p$^-$ substrate 1 of silicon for instance. The p$^-$ substrate 1 seats an n-type n$^-$ layer 2 of silicon for instance. A trench 3 is formed so that it reaches the p$^-$ substrate 1 from the surface of the n$^-$ layer 2. There is an n-type n$^+$ buried layer 4 on the p$^-$ substrate 1.

A p$^+$ region 5 is formed in wall surfaces (the side surfaces and the bottom surface) of the trench 3, by ion implantation for instance. An insulation film 6 of silicon oxide for instance is accumulated on the inner surfaces of the trench, and a buried conductor 7 of poly-silicon for example is buried in the insulation film. There is an inversion preventing layer (first diffusion layer) 8 of the p-type (p$^+$) adjacent to the opening of the trench 3. As shown in FIG. 1A, the inversion preventing layer 8 is disposed only in the vicinity of a p$^+$ diffusion layer 9.

The p$^-$ diffusion layer 9 is disposed in the n$^-$ layer 2, and further, a field oxide film 10 and an inter-layer insulation film 11 are disposed. The field oxide film 10 and the inter-layer insulation film 11 are made of silicon oxide for instance.

An active oxide film 12 of silicon oxide for instance is disposed on the p$^-$ diffusion layer 9. Via an opening formed in the active oxide film 12, an electrode 13 connected with the p$^-$ diffusion layer 9 is disposed. The front electrode 13 is made of aluminum for example. A passivation film 14 of silicon nitride for instance is disposed, covering the front electrode 13 and the inter-layer insulation film 11.

The p$^+$ region 5 is electrically connected with the buried conductor 7 via the inversion preventing layer 8, the p$^+$ diffusion layer 9 and the front electrode 13. Connection between the p$^+$ region 5 and the buried conductor 7 gives rise to a local electric potential difference, which prevents malfunction.

The back surface of the p$^-$ substrate 1 seats a back electrode 15 of aluminum for example.

For easy understanding, FIG. 1A omits the field oxide film 10, the inter-layer insulation film 11 and the passivation film 14 (which is the same with respect to the top views representing embodiments below).

One can see from FIGS. 1A and 1B that an isolation region (island region) between two trenches 3 is electrically isolated from the other region. While the illustrated example is the simplest example that there is one isolation region, multiple isolation regions may be disposed as more trenches 3 are disposed.

A method of manufacturing the semiconductor device 100 according to the first embodiment of the present invention will now be described with reference to FIGS. 2A through 2D. The method of manufacturing the semiconductor device 100 includes the following steps 1 through 5.

Figure 2A:
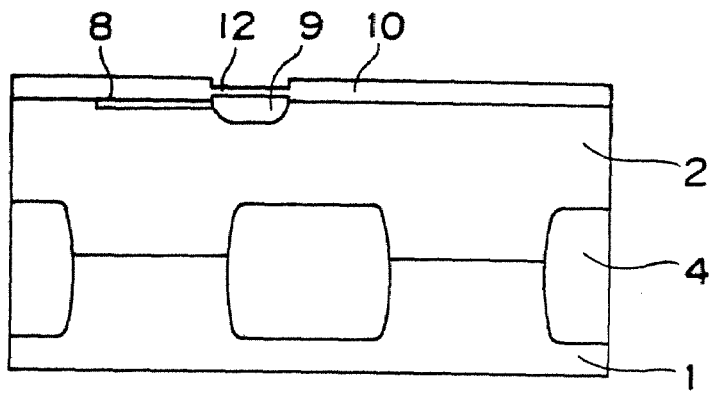
FIGS. 2A through 2D show cross sectional views of steps for manufacturing the semiconductor device according to the first embodiment of the present invention.

Step 1: As shown in FIG. 2A, first, the p$^-$ substrate 1 is prepared, and the n$^+$ buried layer 4 and the n$^-$ layer 2 are formed by crystal growth for instance on the p$^-$ substrate 1. Further, the inversion preventing layer 8 and the p$^+$ diffusion layer 9 are formed by diffusion.

Following this, on the surface of the n$^-$ layer 2, the field oxide film 10 and the active oxide film 12 of silicon oxide for example are formed by plasma oxidation or the like.

Figure 2B:
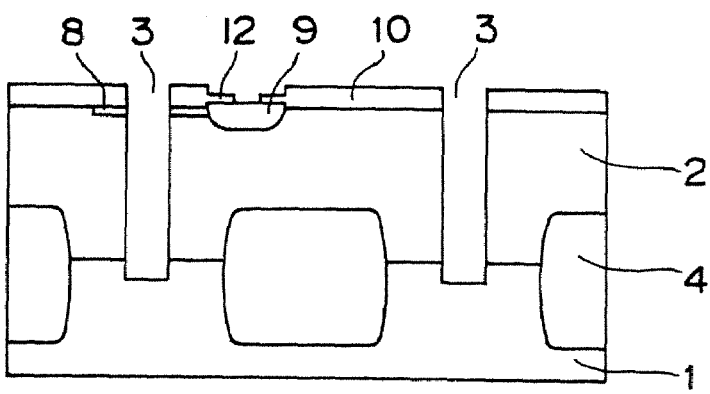

Step 2: As shown in FIG. 2B, after photolithography, the insulation film 10 and the n$^-$ layer 2 are etched through anisotropic etching, whereby the trench 3 reaching the p$^-$ substrate 1 is formed.

Figure 2C:
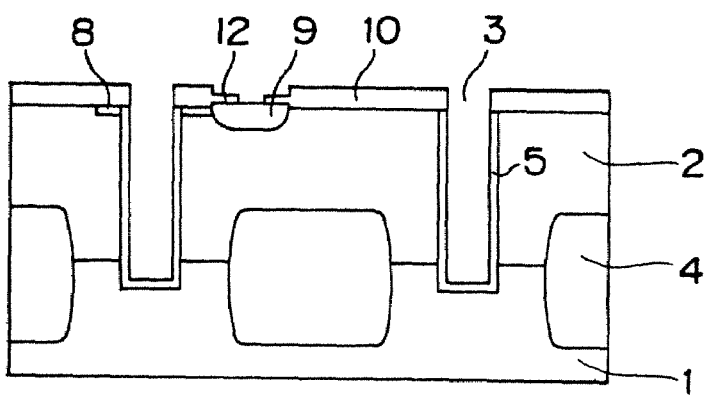

Step 3: As shown in FIG. 2C, the p$^+$ region 5 is formed in the wall surfaces of the trench 3 by ion implantation or the like. The p$^+$ region 5 may be formed only in a particular area of the wall surfaces of the trench 3 if necessary.

Figure 2D:
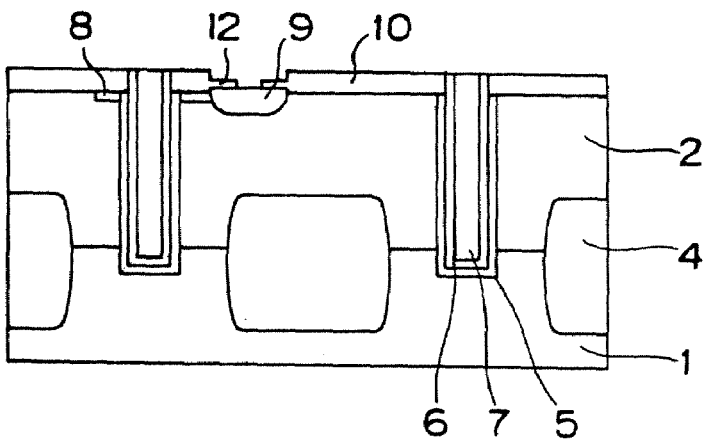

Step 4: As shown in FIG. 2D, the insulation film 6 is formed by CVD for instance, covering the wall surfaces of the trench 3. Poly-silicon or the like is then buried in the trench 3 by CVD or the like, whereby the buried conductor 7 is formed.

Step 5: After forming the inter-layer insulation film 11 of silicon oxide by CVD for example, a necessary opening is formed and the electrode 13 connected with the p$^+$ diffusion layer 9 is formed. The electrode 13 is made of aluminum for instance and formed by vapor deposition or the like. At last, by CVD or the like, the passivation film 14 of silicon nitride for instance is formed. Through these steps, the semiconductor device 100 shown in FIGS. 1A and 1B is completed.

Since trench isolation achieves element isolation in the semiconductor device 100 according to the first embodiment of the present invention, the occupation area size of the isolation region is smaller than where diffusion isolation is used. This makes the semiconductor device compact and highly densely integrated.

Further, the insulation film 6 disposed on the wall surfaces of the trench 3 as well prevents deterioration of the element characteristic owing to a leak current even upon development of stress between the buried conductor 7 and the n$^-$ layer 2.

Second Embodiment

Figure 3A:
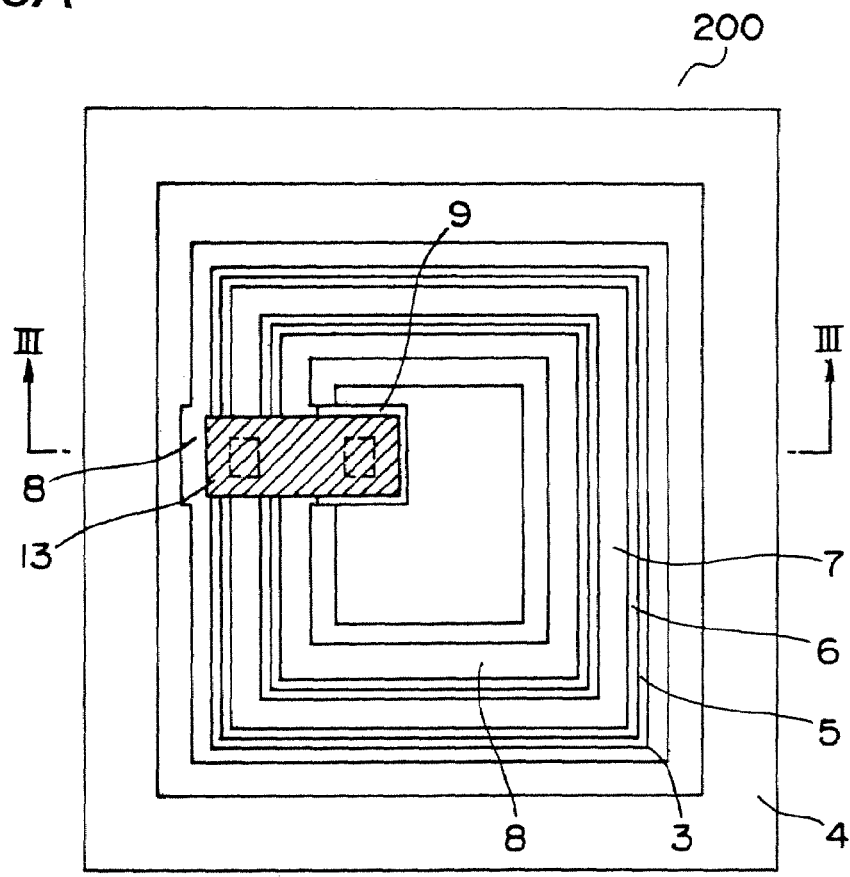
FIG. 3A shows a top view of a semiconductor device according to a second embodiment of the present invention.
Figure 3B:
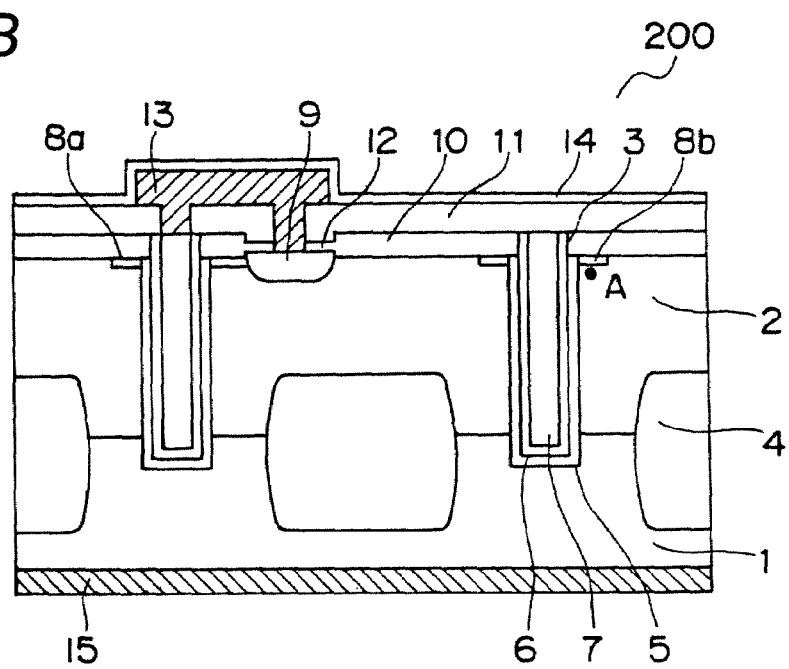
FIG. 3B shows a cross sectional view of a semiconductor device according to a second embodiment of the present invention.

FIGS. 3A and 3B show a semiconductor device according to the second embodiment of the present invention generally denoted at 200. FIG. 3A is a top view, and FIG. 3B is a cross sectional view taken along the direction III-III in FIG. 3A. In FIGS. 3A and 3B, the same reference symbols as those appearing in FIGS. 1A and 1B denote the same or corresponding portions.

As shown in FIG. 3A, in the semiconductor device 200, there is the ring-shaped inversion preventing layer 8 disposed on the both sides of the rectangular trench 3 along the trench. The inversion preventing layer 8 is deeper than the diffusion depth of the p$^+$ region 5 (which is the depth along the direction perpendicular to the side surfaces of the trench 3). The structure is otherwise the same as the semiconductor device 100 described above.

In the semiconductor device 200 according to the second embodiment, application of a voltage upon an isolation region (island region) which is surrounded by the p⁻ substrate 1, the p⁺ region 5 and the inversion preventing layer 8 is likely to cause concentration of an electric field in the vicinity of the top of the trench 3 (which is denoted at A in FIG. 3B). Noting this, the inversion preventing layer 8 is disposed in this portion, which increases the curvature of radius of the junction and mitigates concentration of an electric field. This makes it possible to improve the breakdown voltage and reduce a leak current.

Third Embodiment

Figure 4A:
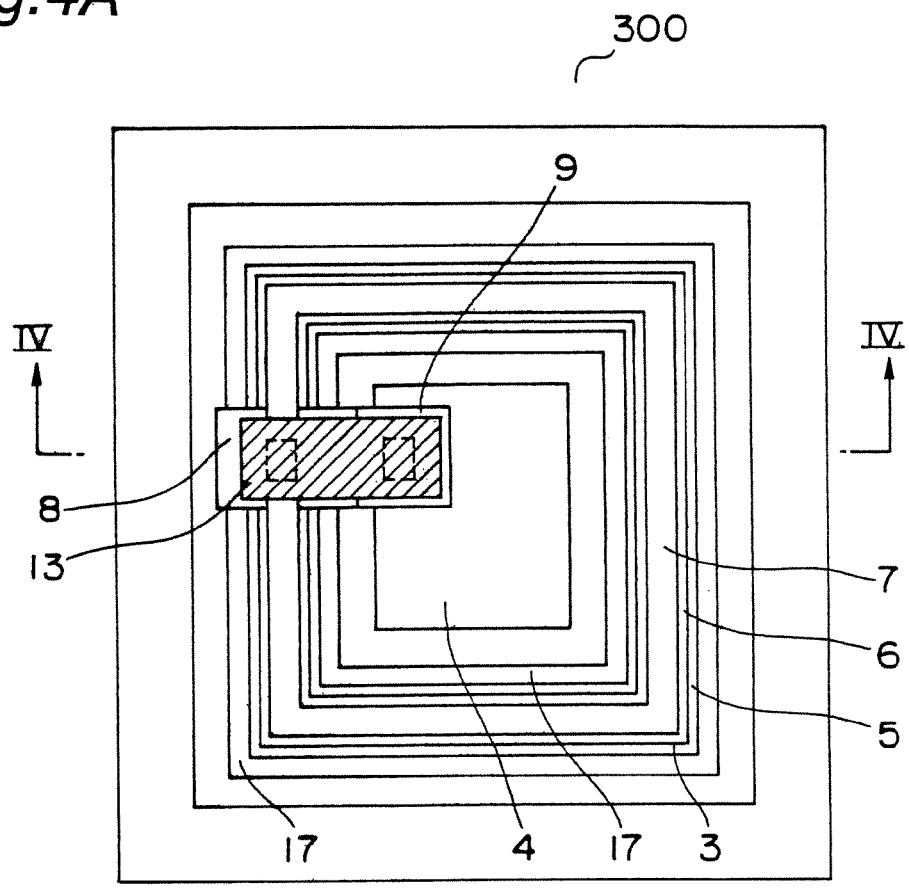
FIG. 4A shows a top view of a semiconductor device according to a third embodiment of the present invention.
Figure 4B:
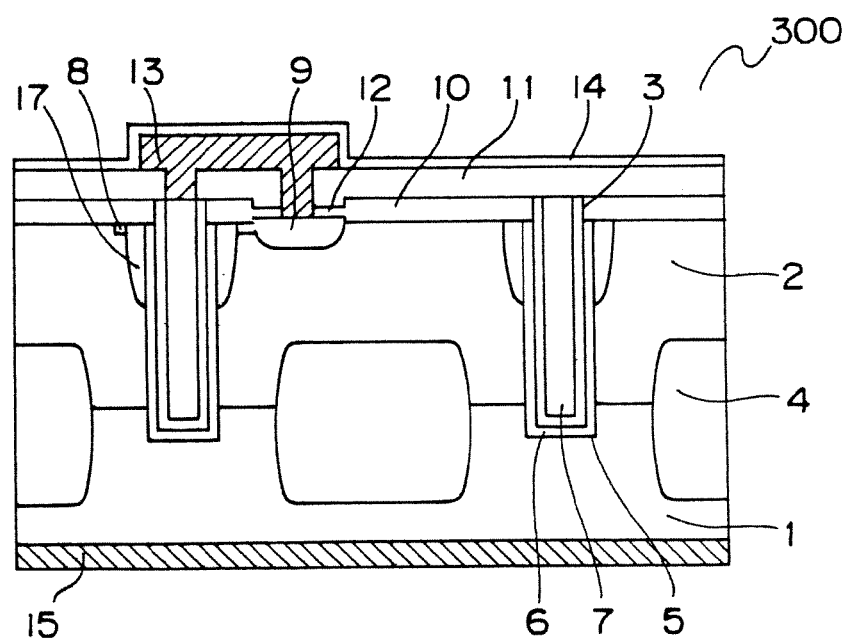
FIG. 4B shows a cross sectional view of a semiconductor device according to a third embodiment of the present invention.

FIGS. 4A and 4B show a semiconductor device according to the third embodiment of the present invention generally denoted at 300. FIG. 4A is a top view, and FIG. 4B is a cross sectional view taken along the direction IV-IV in FIG. 4A. In FIGS. 4A and 4B, the same reference symbols as those appearing in FIGS. 3A and 3B denote the same or corresponding portions.

As shown in FIG. 4B, in addition to what the semiconductor device 200 according to the second embodiment includes, the semiconductor device 300 includes a p diffusion layer (second diffusion layer) 17 deeper than but having a lower concentration than the inversion preventing layer 8 which is disposed between the p⁺ region 5 and the inversion preventing layer 8. The p diffusion layer 17 is disposed in a ring shape on the both sides of the trench 3 along the trench 3. The structure is otherwise the same as the semiconductor device 200 described above.

As described above, while concentration of an electric field would easily occur in the vicinity of the top of the trench 3, the deep and low-concentration p diffusion layer 17 prevents concentration of an electric field in this area. This assures an enhanced and stable breakdown voltage and reduces a leak current.

An ordinary process of manufacturing an integrated circuit often requires forming a p-type well whose concentration is relatively low. Utilizing a step of forming such a p-type well and accordingly forming the p diffusion layer 17 at the same time therefore, it is possible to form the p diffusion layer 17 without adding another fabrication step or a manufacturing cost.

Combination of the inversion preventing layer 8 and the p diffusion layer 17 also makes it possible to attain optimal manufacture for obtaining a desired characteristic.

Fourth Embodiment

Figure 5A:
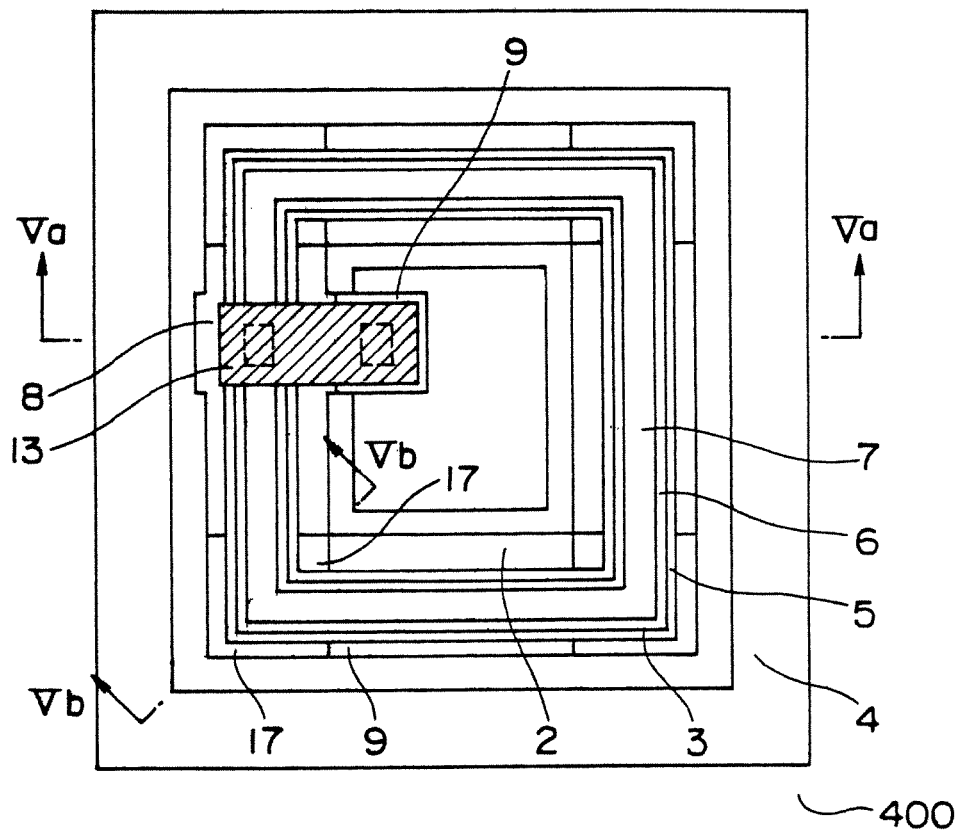
FIG. 5A shows a top view of a semiconductor device according to a fourth embodiment of the present invention.
Figure 5B:
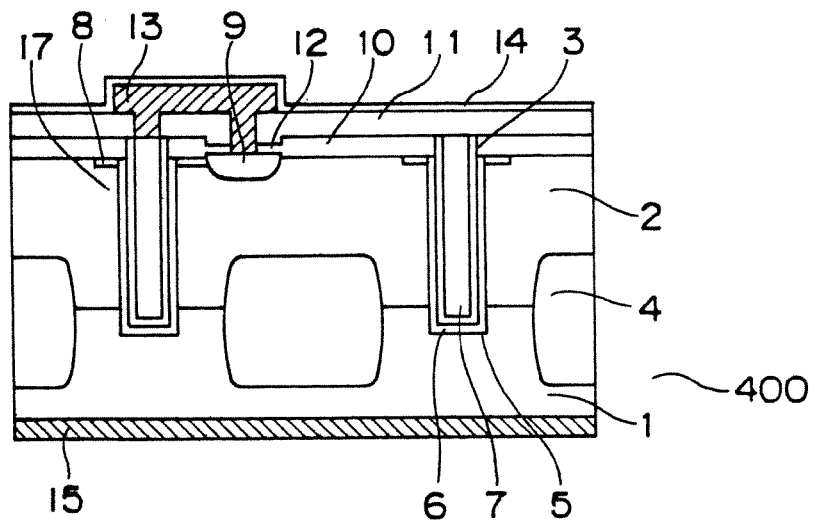
FIGS. 5B and 5C show a cross sectional views of a semiconductor device according to a fourth embodiment of the present invention.
Figure 5C:
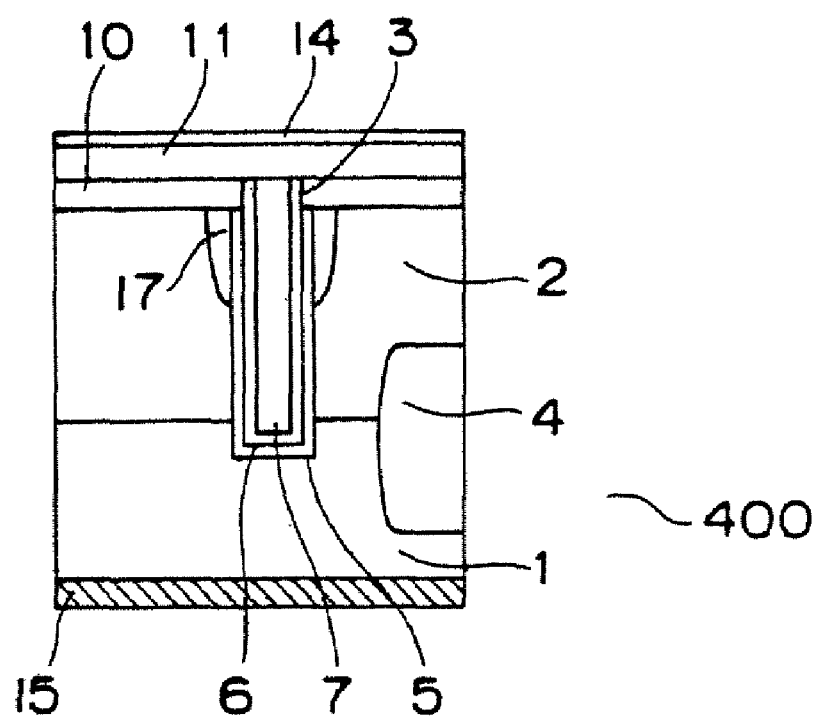

FIGS. 5A through 5C show a semiconductor device according to the fourth embodiment of the present invention generally denoted at 400. FIG. 5A is a top view, FIG. 5B is a cross sectional view taken along the direction Va-Va in FIG. 5A, and FIG. 5C is a cross sectional view taken along the direction Vb-Vb in FIG. 5A. In FIGS. 5A through 5C, the same reference symbols as those appearing in FIGS. 4A and 4B denote the same or corresponding portions.

As shown in FIG. 5B, in the semiconductor device 400, in an area where the trench 3 is linear, the inversion preventing layer 8 is disposed on the both sides of the trench 3 along the trench 3. Meanwhile, in a corner section where the trench 3 bends almost at a right angle, the p diffusion layer 17 is disposed on the both sides of the trench 3 along the trench 3 as shown in FIG. 5C. The structure is otherwise the same as the semiconductor device 300 described above.

As described above, in the semiconductor device 400 according to the fourth embodiment, the p diffusion layer 17 disposed around the corner sections of the trench 3 where electric field concentration can particularly easily occur eases concentration of an electric field in the corner sections. This improves the breakdown voltage and reduces a leak current.

Fifth Embodiment

Figure 6:
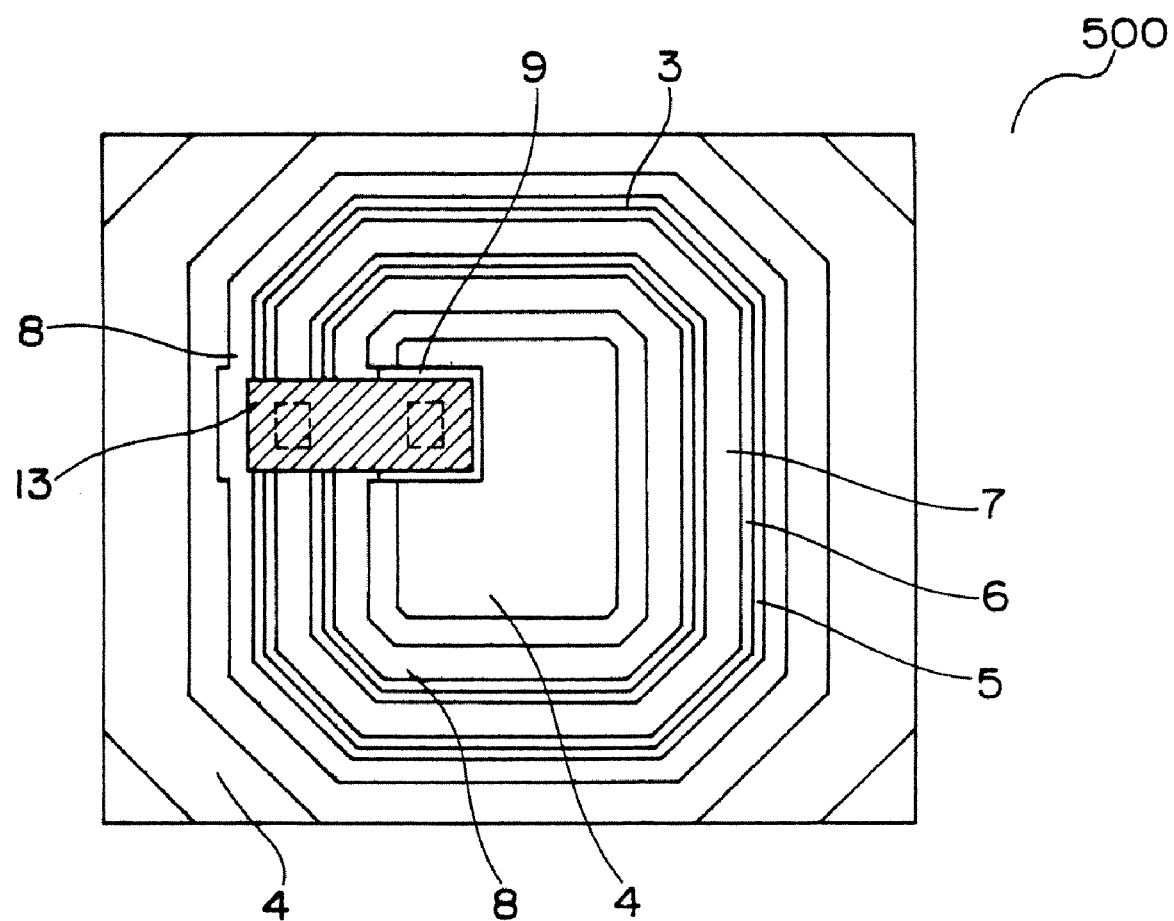
FIG. 6 is a top view of a semiconductor device according to a fifth embodiment of the present invention.

FIG. 6 is a top view of a semiconductor device according to the fifth embodiment of the present invention generally denoted at 500. In FIG. 6, the same reference symbols as those appearing in FIGS. 3A and 3B denote the same or corresponding portions.

In the semiconductor device 500 according to the fifth embodiment, the arrangement of trench 3 which is in a rectangular shape as shown in FIG. 3A in the case of the semiconductor device 200 is changed to an octagonal arrangement as shown in FIG. 6. This makes the angle at which the trench 3 bends in the corner sections more moderate than a right angle (the semiconductor device 200). Further, the inversion preventing layer 8 is disposed on the both sides of the trench 3 along the trench 3.

The structure is otherwise the same as the semiconductor device 200 which is shown in FIGS. 3A and 3B.

As described above, in the semiconductor device 500 according to the fifth embodiment, the moderated angle at which the trench 3 bends mitigates concentration of an electric field in the corner sections. This improves the breakdown voltage and reduces a leak current.

Instead of forming the trench 3 octagonal as shown in FIG. 6, the trench 3 may be formed in other polygonal shape or a circular shape, in which case as well it is possible to ease concentration of an electric field in the corner sections.

The structure of the trench 3 according to the fifth embodiment is applicable also to the semiconductor devices described in relation to the second through the fourth embodiments.

Sixth Embodiment

Figure 7:
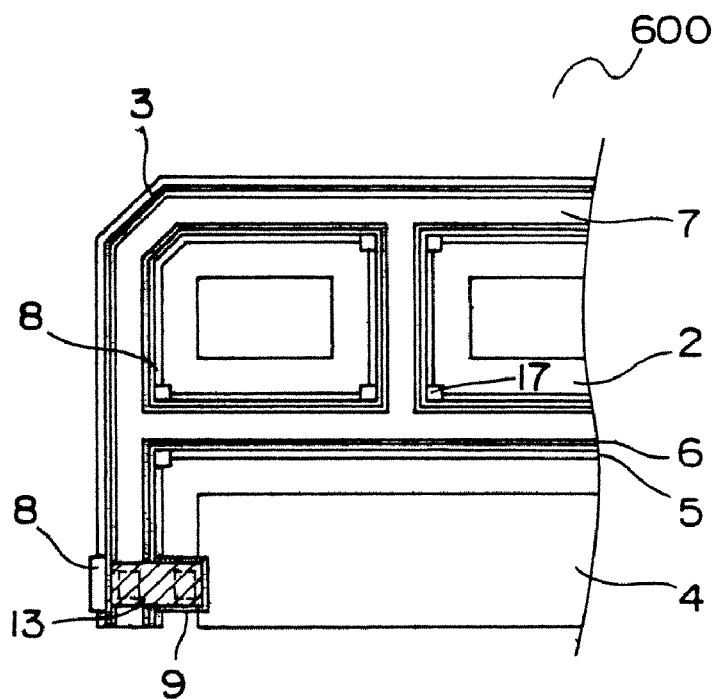
FIG. 7 is a top view of a semiconductor device according to a sixth embodiment of the present invention.

FIG. 7 is a top view which shows part of a semiconductor device according to the sixth embodiment of the present invention generally denoted at 600. In FIG. 7, the same reference symbols as those appearing in FIGS. 4A and 4B denote the same or corresponding portions.

The semiconductor device 600 according to the sixth embodiment includes plural isolation regions surrounded by the trench 3. In the semiconductor device 600, there are portions where the trench 3 bends approximately at a right angle and portions where the trench 3 bends at a smaller angle than that, of which the p diffusion layer 17 is formed in those portions where the trench 3 bends approximately at a right angle.

The buried conductor 7 inside the trench 3 is partially electrically connected via the p⁺ region 5 formed in the side walls of the trench 3, the inversion preventing layer 8 and the p⁺ diffusion layer 9.

As described above, in the semiconductor device 600 according to the sixth embodiment, the angle at which the trench 3 bends is smaller than a right angle and the p diffusion layer 17 is provided in such sections where the trench 3 must bend at a right angle due to a design constraint. This permits mitigating concentration of an electric field in the corner sections where the trench 3 bends, improving the breakdown voltage and reducing a leak current.

Of course, the p diffusion 17 may be formed not only in the corner sections but along the trench 3 as well.

Seventh Embodiment

Figure 8:
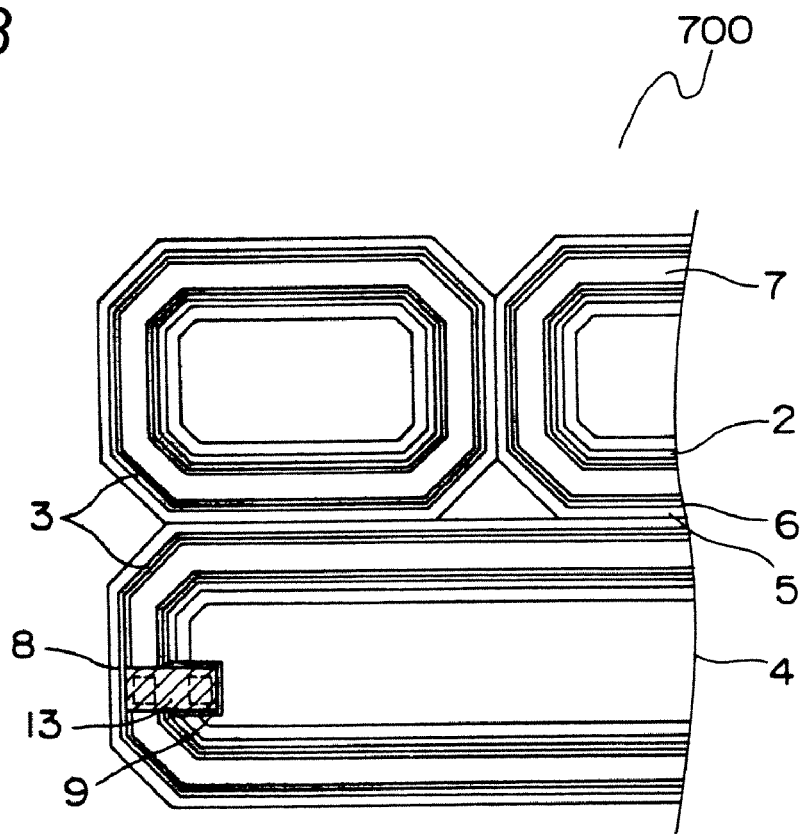
FIG. 8 is a top view of a semiconductor device according to a seventh embodiment of the present invention.

FIG. 8 is a top view which shows part of a semiconductor device according to the seventh embodiment of the present invention generally denoted at 700. In FIG. 8, the same reference symbols as those appearing in FIGS. 4A and 4B denote the same or corresponding portions.

The semiconductor device 700 according to the seventh embodiment includes plural isolation regions surrounded by the trenches 3. To be noted in particular as for the semiconductor device 700 is the structure that each isolation region is surrounded by an octagonal trench 3.

As described above, in the semiconductor device 700 according to the seventh embodiment, the angle at which all trenches 3 bend is moderate, which eases concentration of an electric field in the corner sections. This enhances the breakdown voltage and reduces a leak current.

The buried conductors 7 inside the trenches 3 are partially electrically connected via the $p^+$ regions 5 of the trench 3, the inversion preventing layer 8 and the $p^+$ diffusion layer 9.

Instead of forming the trenches 3 octagonal as shown in FIG. 8, the trenches 3 may be formed in other polygonal shape or a circular shape, in which case as well it is possible to ease concentration of an electric field in the corner sections.

It is not always necessary that all trenches have such a shape. This shape may be used only for those isolation regions which demand reduction of a leak current.

Eighth Embodiment

Figure 9A:
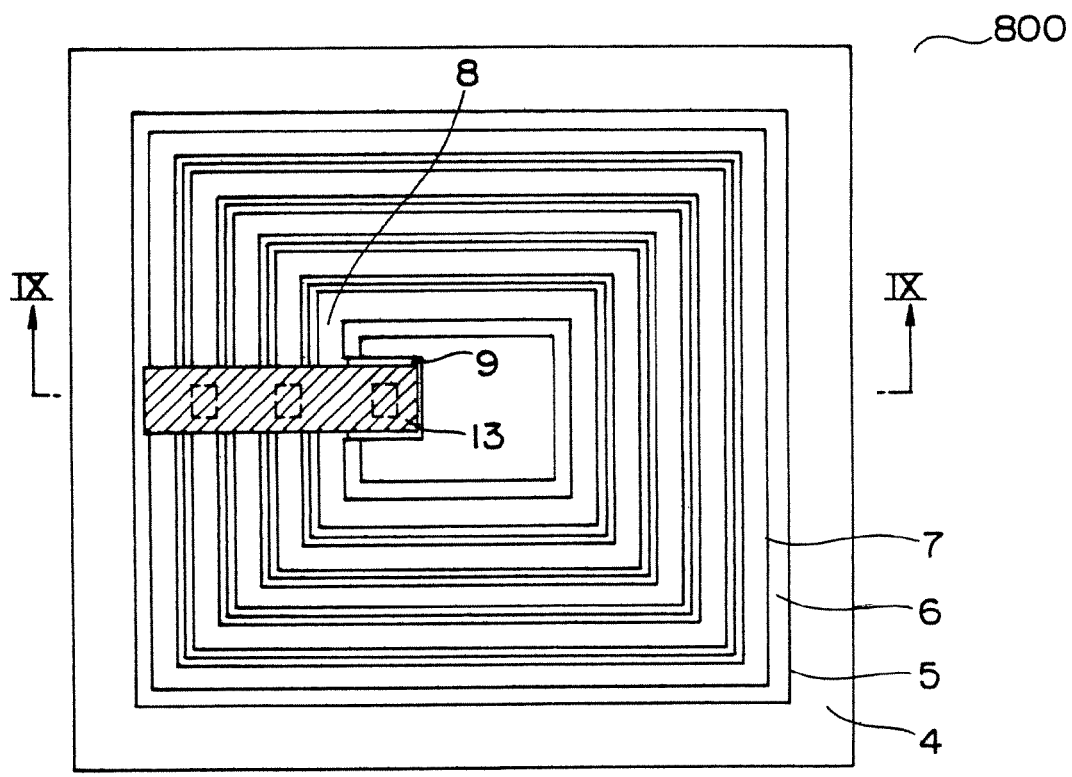
FIG. 9A shows a top view of a semiconductor device according to an eighth embodiment of the present invention.
Figure 9B:
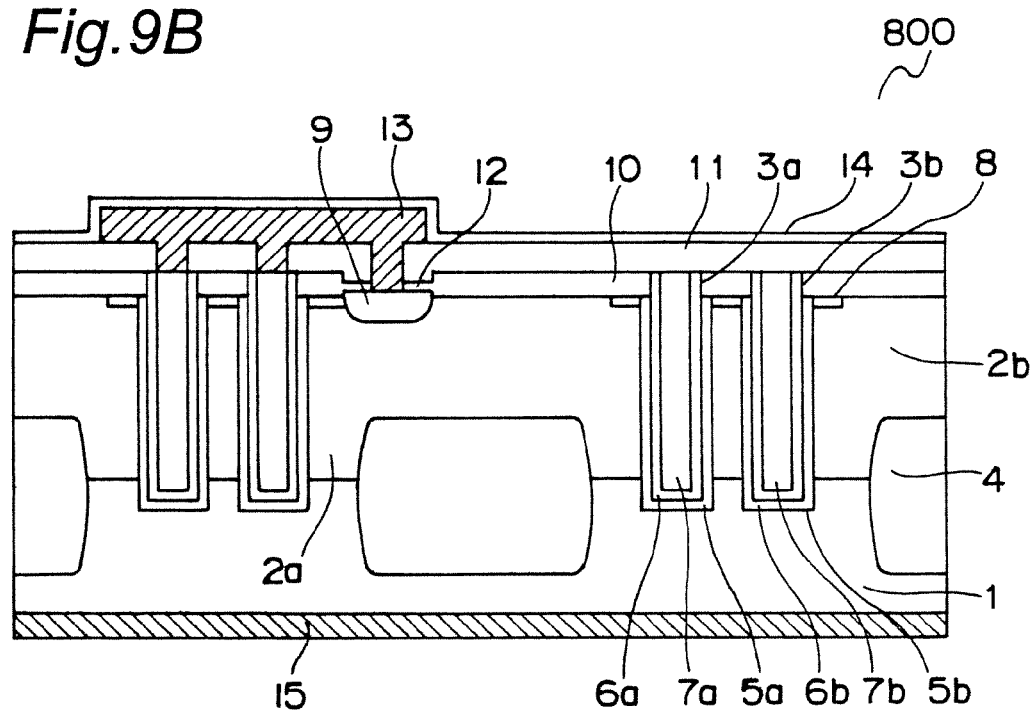
FIG. 9B shows a cross sectional view of a semiconductor device according to an eighth embodiment of the present invention.

FIGS. 9A and 9B show a semiconductor device according to the eighth embodiment of the present invention generally denoted at 800. FIG. 9A is a top view, and FIG. 9B is a cross sectional view taken along the direction IX-IX in FIG. 9A. In FIGS. 9A and 9B, the same reference symbols as those appearing in FIGS. 4A and 4B denote the same or corresponding portions. The alphabetic subscripts beside the reference symbols in FIG. 9B are for distinction between different portions in the same structure (This similarly applies also to the embodiments described below.).

In the semiconductor device 800 according to the eighth embodiment, double trenches 3 are formed. The structure is otherwise similar to that of the semiconductor device 200 according to the second embodiment. While this embodiment requires using a structure that the double trench 3 surrounds one isolation region, one trench 3 may surround all plural isolation regions each of which is surrounded by a single trench 3.

The buried conductors 7 inside the trenches 3 are partially electrically connected with via the $p^+$ region 5 of the trench 3, the inversion preventing layer 8 and the $p^+$ diffusion layer 9.

In the semiconductor device 800, since the double trenches 3 are formed, the gap between adjacent isolation regions is wider than that where a single trench 3 is formed. This makes it possible to reduce the current amplification rate hFE of a parasitic PNP transistor (an $n^-$ layer 2a, the $p^-$ substrate 1, an $n^-$ layer 2b) which is created between the isolation regions.

The hFE level of the parasitic transistor created between the isolation regions can be lowered as more trenches 3 are disposed and the distances among the isolation regions are widened. Hence, the number of the trenches 3 may be increased in accordance with a necessity to thereby reduce hFE.

Although the inversion preventing layer 8 is disposed around the trenches 3 in the semiconductor device 800 according to the eighth embodiment, the p region 17 may be formed as described above. Further, the shape of the trenches 3 may be polygonal or circular.

Ninth Embodiment

Figure 10A:
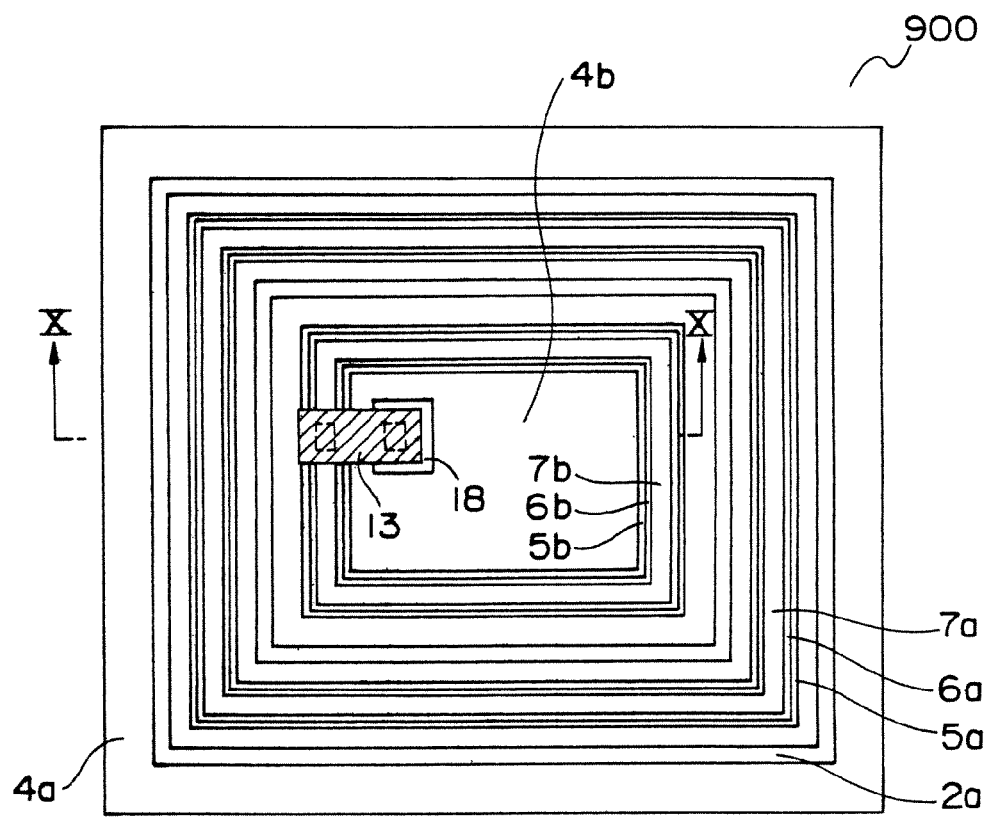
FIG. 10A shows a top view of a semiconductor device according to a ninth embodiment of the present invention.
Figure 10B:
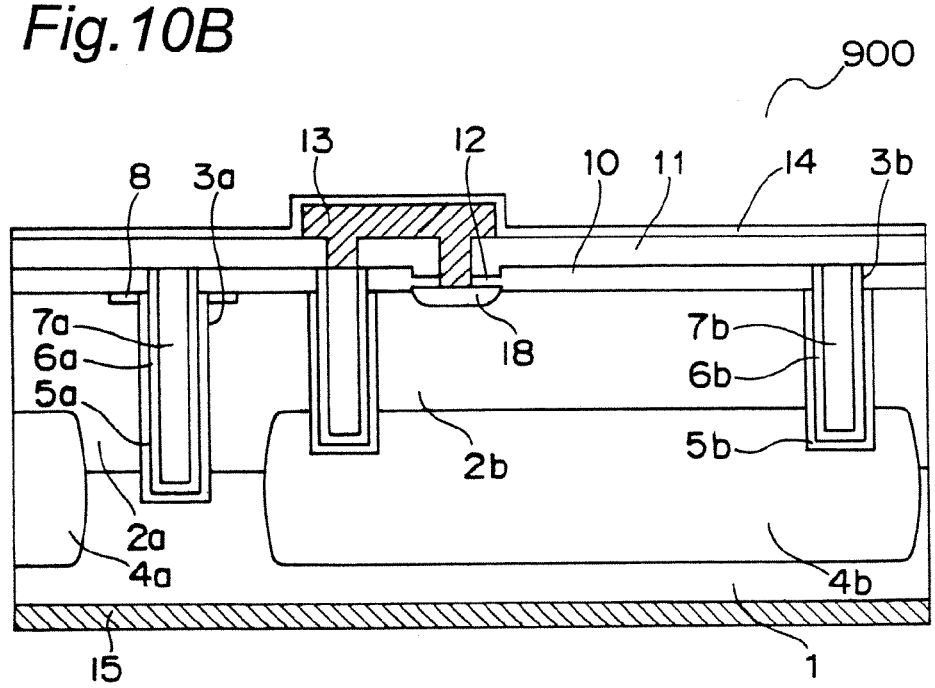
FIG. 10B shows a cross sectional view of a semiconductor device according to a ninth embodiment of the present invention.

FIGS. 10A and 10B show a semiconductor device according to the ninth embodiment of the present invention generally denoted at 900. FIG. 10A is a top view, and FIG. 10B is a cross sectional view taken along the direction X-X in FIG. 10A. The same reference symbols as those appearing in FIGS. 9A and 9B denote the same or corresponding portions.

In the semiconductor device 900 according to the ninth embodiment, double trenches 3 are formed. The inner trench 3b is formed so that it reaches an $n^+$ buried layer 4b but will not penetrate the same, while the outer trench 3a is formed so that it reaches the $p^-$ substrate 1. The inner trench structure aims at prevention of a parasitic operation, and the outer trench structure aims at realizing element isolation.

The semiconductor device 900 includes the isolation region surrounded by the trench 3b which is formed so that it reaches the $n^+$ buried layer 4b, and a buried conductor 7b buried in the trench 3b is connected to the $n^-$ layer 2b via an $n^+$ diffusion layer 18.

In the semiconductor device 900 having such a structure, there is no path for a current to flow between the $n^-$ layer 2b and the $p^-$ substrate 1, and the only one path is a path which goes through the buried layer 4b. Hence, it is possible to significantly suppress an operation of a parasitic PNP transistor like the one formed by the $n^-$ layer 2a, the $p^-$ substrate 1 and the $n^-$ layer 2b which are provided inside the trench structure section (5b, 6b, 7b).

Although the semiconductor device 900 is related to an example that the depth of the outer isolation trench structure (5a, 6a, 7a) is different from that of the inner trench (6b, 7b) for prevention of a parasitic operation, the inner trench may have the same depth as the outer trench as long as the inner trench satisfies a condition that the inner trench is deeper than the junction between the $n^-$ layer 2a and the $p^-$ substrate 1 and a condition that the inner trench does not penetrate through the $n^+$ buried layer 4b.

In that instance, two types of trench structures can be formed at the same time, which simplifies a manufacturing process.

The ring-like trench structure (5b, 6b, 7b) reaching the $n^+$ buried layer 4b disposed in the area surrounded by the trench prevents the element within the area surrounded by the trench structure (5b, 6b, 7b) from interfering with the structure outside the trench structure (5b, 6b, 7b).

Tenth Embodiment

Figure 11A:
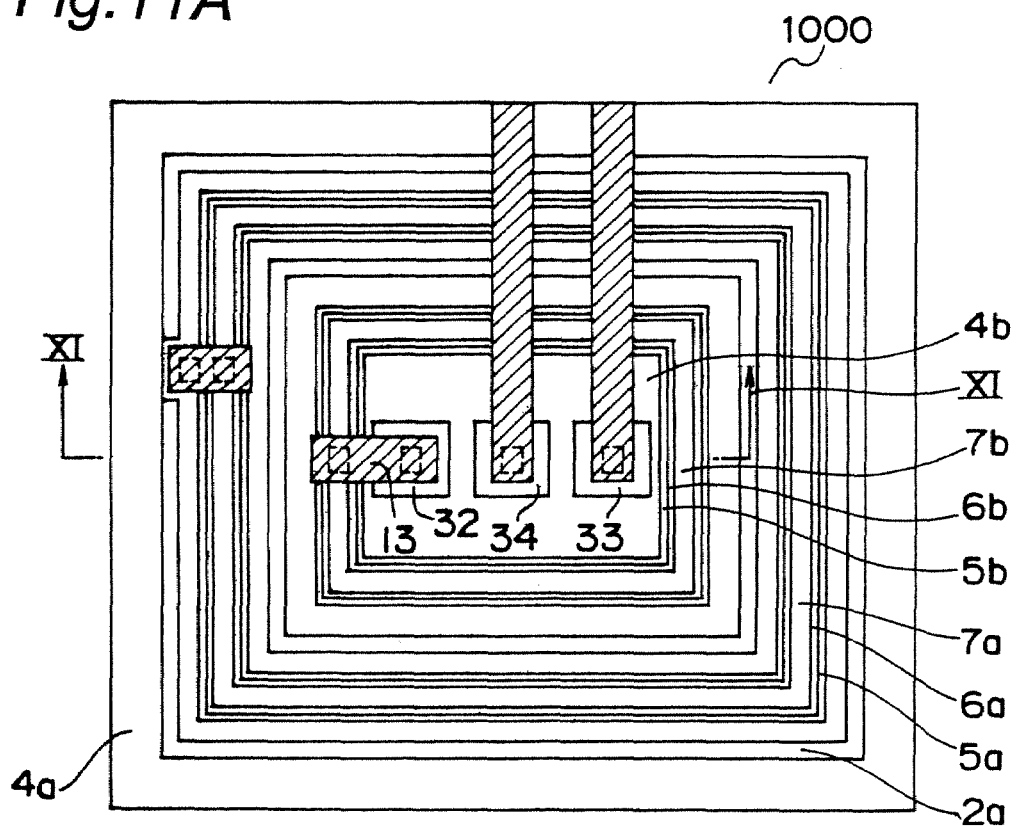
FIG. 11A shows a top view of a semiconductor device according to a tenth embodiment of the present invention.
Figure 11B:
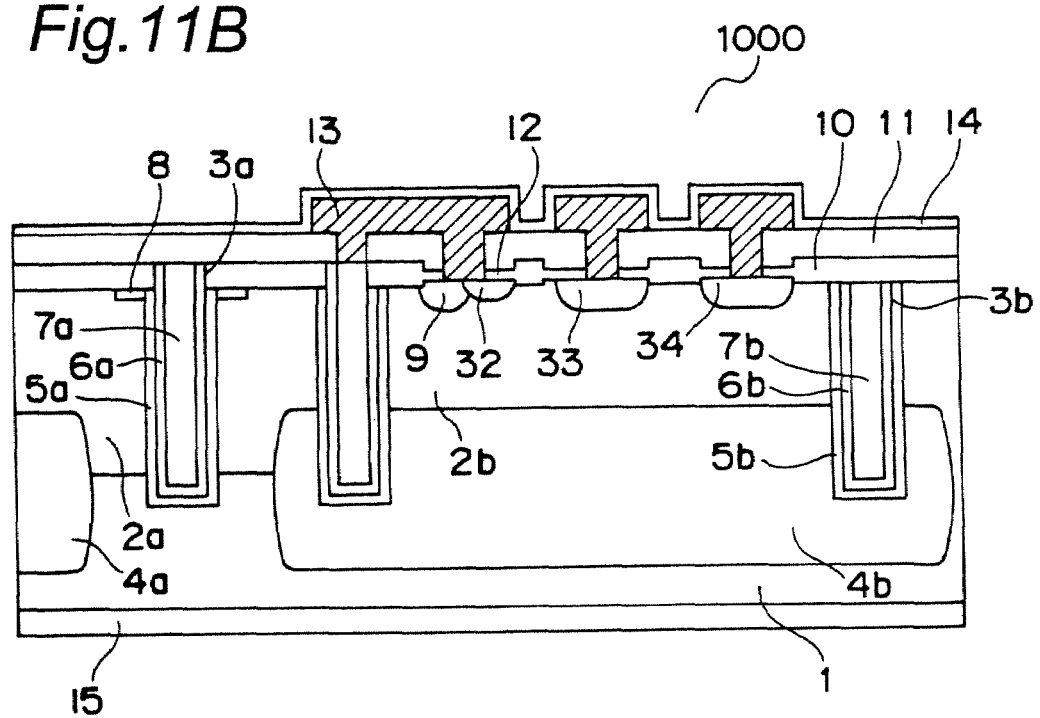
FIG. 11B shows a cross sectional view of a semiconductor device according to a tenth embodiment of the present invention.

FIGS. 11A and 11B show a semiconductor device according to the tenth embodiment of the present invention generally denoted at 1000. FIG. 11A is a top view, and FIG. 11B is a cross sectional view taken along the direction XI-XI in FIG. 11A. In FIGS. 11A and 11B, the same reference symbols as those appearing in FIGS. 9A and 9B denote the same or corresponding portions.

In the semiconductor device 1000 according to the tenth embodiment, double trenches 3 are formed. The inner trench 3b is formed so that it reaches the $n^+$ buried layer 4b, while the outer trench 3a is formed so that it reaches the $p^-$ substrate 1. The inner trench structure aims at prevention of a parasitic operation, and the outer trench structure aims at realizing element isolation.

In the semiconductor device 1000, a PNP transistor element is formed in the isolation region surrounded by the trench isolation structure (5b, 6b, 7b), and the buried conductor 7b is connected to the base layer 18 of a PNP transistor.

In the PNP transistor, its emitter is formed by a p+ diffusion layer 9a, its collector is formed by a p+ diffusion layer 9b, and its base is formed by the n+ diffusion layer 18. The base is connected to the n− layer 2b.

Further, the trench structure (5a, 6a, 7a) for isolation and the trench structure (5b, 6b, 7b) for prevention of a parasitic operation have the same trench structures and are formed deeper than the junction between the n− layer 2a and the p− substrate 1 and deep enough to reach the n+ buried layer 4b but not deep enough to penetrate through the n+ buried layer 4b.

There are the p+ diffusion layers 5a and 5b in the wall surfaces of the trenches 3a and 3b. The p+ diffusion layer 5a is connected to the buried conductor 7a inside the associated trench, the p+ diffusion layer 5b is connected to the buried conductor 7b inside the associated trench, and the both are at a base potential.

When such a PNP transistor is formed, the emitter 9a, the n− layer 2b (the n+ buried layer 4b) and the p− substrate 1 create a parasitic PNP transistor. But for the trench structure (5b, 6b, 7b) for prevention of a parasitic operation, holes from the emitter 33 will flow into the substrate via the n− layer 2b without getting caught by the collector 34 and cause malfunction.

In contrast, in the semiconductor device 1000 according to the tenth embodiment, the trench structure (5b, 6b, 7b) for prevention of a parasitic operation shuts off a current path which goes through the emitter 33, the n− layer 2b and the p− substrate 1 so that the collector 34 collects holes flowing from the emitter 33, thereby greatly reducing hFE of the parasitic PNP transistor and improving the resistance against malfunction.

While the foregoing has described the tenth embodiment taking an example of a PNP transistor, the trench structure (5b, 6b, 7b) for prevention of a parasitic operation can reduce hFE of a parasitic PNP transistor even in other element which includes the parasitic transistor.

Further, in the semiconductor device 1000 according to the tenth embodiment, the trench structure (5a, 6a, 7a) for isolation and the trench structure (5b, 6b, 7b) for prevention of a parasitic operation have the same structures and can therefore be manufactured through the same manufacturing process. Hence, use of the manufacturing process described in relation to the first embodiment (FIGS. 2A through 2D) makes it possible to fabricate these trench structures without adding any more steps.

In the semiconductor device 1000 according to the tenth embodiment, the trench structure reaching the n+ buried layer 4b surrounds the circuit part, thereby suppressing a parasitic operation and preventing the circuit from malfunctioning.

Eleventh Embodiment

Figure 12A:
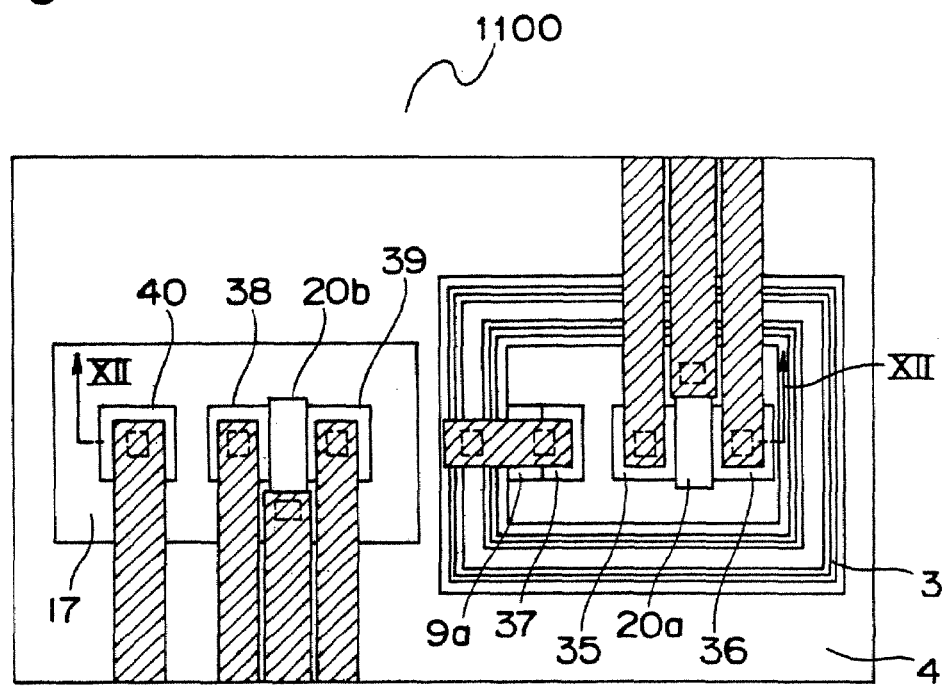
FIG. 12A shows a top view of a semiconductor device according to an eleventh embodiment of the present invention.
Figure 12B:
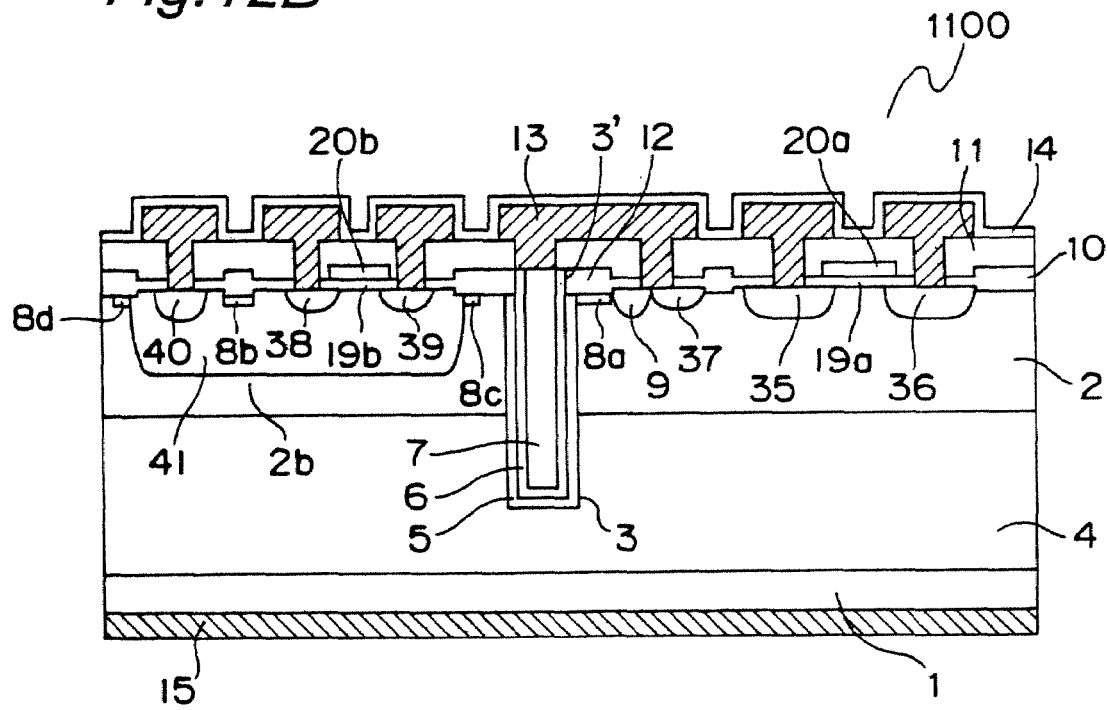
FIG. 12B shows a cross sectional view of a semiconductor device according to an eleventh embodiment of the present invention.

FIGS. 12A and 12B show a semiconductor device according to the eleventh embodiment of the present invention generally denoted at 1100. FIG. 12A is a top view, and FIG. 12B is a cross sectional view taken along the direction XII-XII in FIG. 12A. In FIGS. 12A and 12B, the same reference symbols as those appearing in FIGS. 9A and 9B denote the same or corresponding portions.

In the semiconductor device 1100 according to the eleventh embodiment, the trench 3 is formed to reach the n+ buried layer and accordingly serves to prevent a parasitic operation.

Further, the semiconductor device 1100 includes a p-ch MOSFET and an N-ch MOSFET, and has a structure that the P-ch MOSFET is formed in an isolation region surrounded by the trench 3. The buried conductor 7b inside the trench 3 and the p+ diffusion layer 5 formed in the wall surfaces of the trench 3 are connected with a back gate 37 of the P-ch MOSFET.

The N-ch MOSFET is formed by a source 38, a drain 39 and a gate 20b which are formed inside a p well 41. Meanwhile, the P-ch MOSFET is formed inside the n- layer 2a which is surrounded by the trench 3, and is formed by a source 35, a drain 36 and a gate 20a.

In this structure, a few parasitic transistors are created between the diffusion regions of the two MOSFETs which may be the source 35 of the P-ch MOSFET, the n− layer 2 and the p well 41.

In this relation, as the trench structure (5b, 6b, 7b) for prevention of a parasitic operation is provided, the P-ch MOSFET and the N-ch MOSFET are isolated from each other, which shuts off the path which goes through the n− layer 2b whose hFE is large among the parasitic paths.

This significantly reduces hFE of the parasitic PNP transistor and improves the resistance against malfunction.

Twelfth Embodiment

Figure 13A:
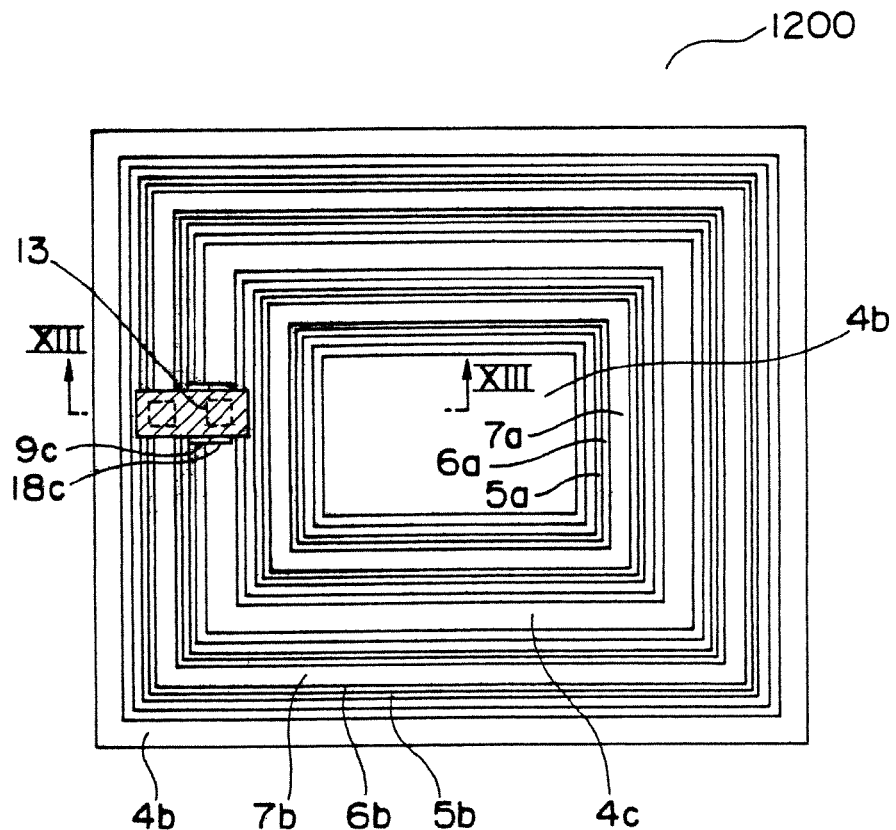
FIG. 13A shows a top view of a semiconductor device according to a twelfth embodiment of the present invention.
Figure 13B:
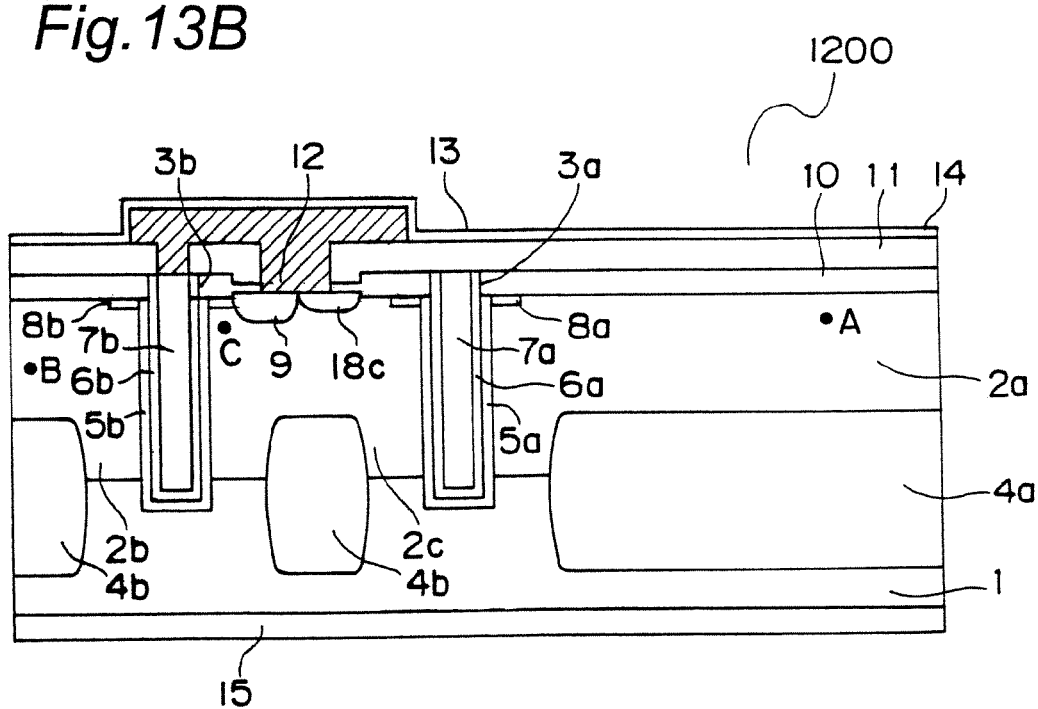
FIG. 13B shows a cross sectional view of a semiconductor device according to a twelfth embodiment of the present invention.

FIGS. 13A and 13B show a semiconductor device according to the twelfth embodiment of the present invention generally denoted at 1200. FIG. 13A is a top view and FIG. 13B is a cross sectional view taken along the direction XIII-XIII in FIG. 13A. In FIGS. 13A and 13B, the same reference symbols as those appearing in FIGS. 9A and 9B denote the same or corresponding portions.

The semiconductor device 1200 includes double trenches 3a and 3b. A region C for hFE reduction is formed between regions A and B which are at different electric potentials (FIG. 13B shows the regions A, B and C.). The region C contains an n+ buried layer 4c, an n+ diffusion layer 18c and the n+ diffusion layer 9 which are connected by a common contact, and the p+ region 5a in the wall surfaces of the trench structure which is connected to the n+ diffusion layer 9.

In this structure, electrons on their way from the region A to the region B flow to the n+ diffusion layer 18 from the n+ buried layer 4c and to the p− substrate 1 from the p+ diffusion layer 9c which has the common contact. This significantly reduces the current flowing to the region B. In other words, considering a parasitic NPN transistor formed by the n− layer 2a, the p− substrate 1 and the n− layer 2b belonging to the region A, hFE of this parasitic NPN transistor can be lowered.

Although the wider the n+ buried layer 4c is, more significant the hFE lowering effect of the region C is, an excessively wide width increases the chip area size. Replacing a diffusion isolation structure with the region C which is a trench isolation structure greatly reduces the chip area size.

Thirteenth Embodiment

Figure 14A:
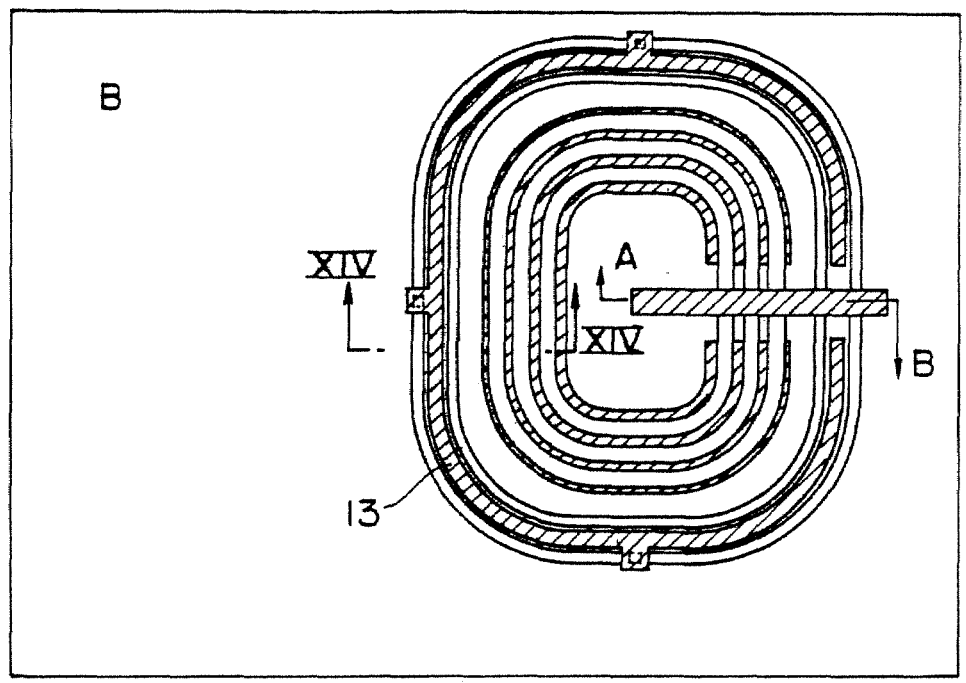
FIG. 14A shows a top view of a semiconductor device according to a thirteenth embodiment of the present invention.
Figure 14B:
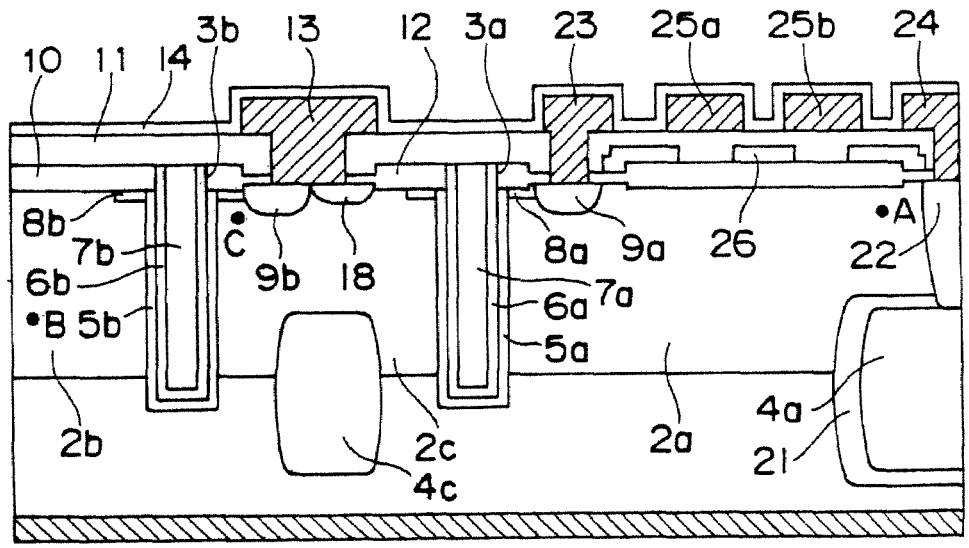
FIG. 14B shows a cross sectional view of a semiconductor device according to a thirteenth embodiment of the present invention.

FIGS. 14A and 14B show a semiconductor device according to the thirteenth embodiment of the present invention generally denoted at 1300. FIG. 14A is a top view and FIG. 14B is a cross sectional view taken along the direction XIV-XIV in FIG. 14A. In FIGS. 14A and 14B, the same reference symbols as those appearing in FIGS. 9A and 9B denote the same or corresponding portions.

The semiconductor device 1300 according to the thirteenth embodiment is application of a structure which uses a trench isolation structure to reduce hFE between isolation regions (hFE lowering structure) to a high-voltage structure. In the semiconductor device 1300, the region A is the high-voltage section, the region B is an ordinary circuit part and the region C is the hFE lowering structure part.

In the semiconductor device 1300, there is a field plate structure (25, 26) for maintaining a high breakdown voltage provided in the high-voltage section wherein an electrode 24 is for the high voltage side while an electrode 23 is for the low voltage side. Denoted at 21 is an n⁻ buried layer and denoted at 22 is an n⁺ layer.

In the event the semiconductor device used as an inverter or the like, the voltage at the electrode 24 for the high voltage side changes due to switching. The parasitic inductance on wiring or the like could develop a negative voltage at the electrode 24. This will permit electrons flow to the circuit part B from the high-voltage region A and cause malfunction.

In contrast, the hFE lowering structure (region C) disposed between the region A and the region B significantly reduces hFE of a parasitic NPN transistor formed by the n⁻ layer 2a of the high-voltage section (region A), the p⁻ substrate 1 and the n⁻ layer 2b of the circuit part (region B) in the semiconductor device 1300 according to the thirteenth embodiment as described above. It is therefore possible to suppress influx of electrons into the circuit part (region B) and prevent the circuit part (region B) from malfunctioning.

Further, use of trench isolation (5, 6, 7) instead of diffusion isolation prevents malfunction of the circuit while minimizing an increase of the chip area size.

Fourteenth Embodiment

Figure 15A:
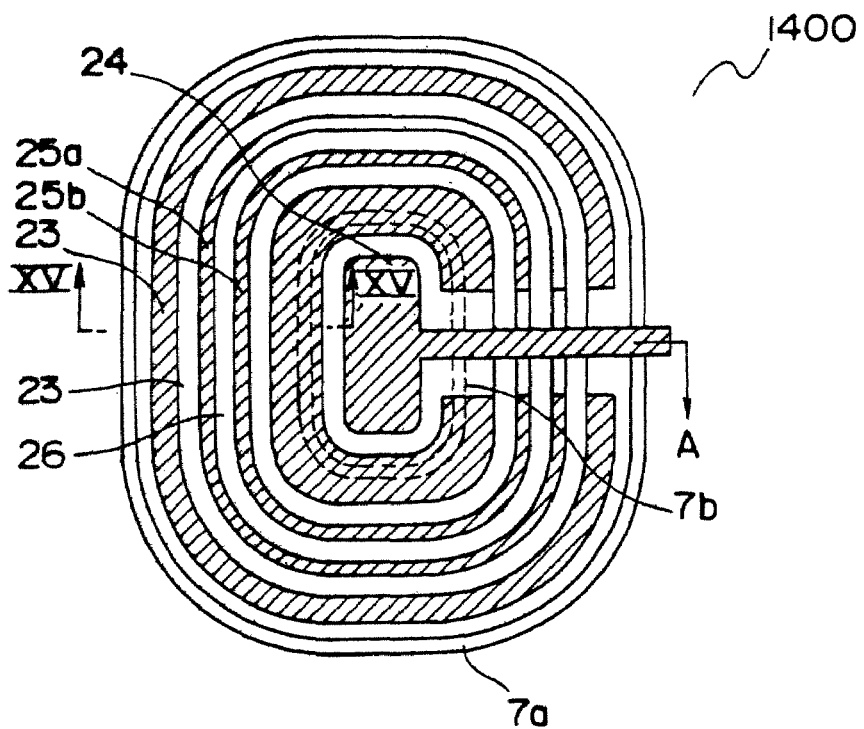
FIG. 15A shows a top view of a semiconductor device according to a fourteenth embodiment of the present invention.
Figure 15B:
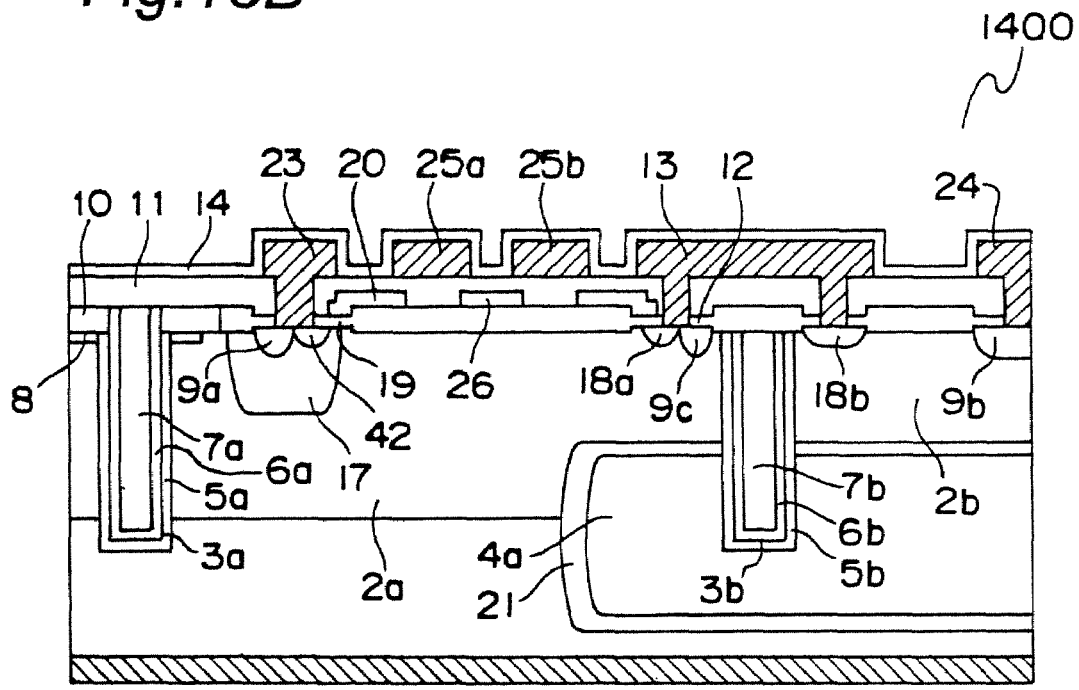
FIG. 15B shows a cross sectional view of a semiconductor device according to a fourteenth embodiment of the present invention.

FIGS. 15A and 15B show a semiconductor device according to the fourteenth embodiment of the present invention generally denoted at 1400. FIG. 15A is a top view and FIG. 15B is a cross sectional view taken along the direction XV-XV in FIG. 15A. In FIGS. 15A and 15B, the same reference symbols as those appearing in FIGS. 9A and 9B denote the same or corresponding portions.

The semiconductor device 1400 according to the fourteenth embodiment is application of a trench isolation structure to a high-voltage level shifter structure, and uses a reverse-connection diode. In the semiconductor device 1400, there is the field plate structure (25, 26) for maintaining a high breakdown voltage provided in the high-voltage section wherein the electrode 24 is for the high voltage side while the electrode 23 is for the low voltage side. Further, a MOSFET is formed by a gate oxide film 19, a gate electrode 20, a p well 17, a source 42 and the n⁻ layer 2a.

In addition, the trench structure section (5b, 6b, 7b) is disposed which surrounds the electrode 24 for the high voltage side and reaches the n⁺ buried layer 4a which is disposed on the high voltage side. Only the n⁺ diffusion layer 9b is connected with the electrode 24 for the high voltage side, and connection to the low voltage side is provided through n-type regions 18a and 18b. The trench structure isolates the n⁻ layer 2b on the high voltage side from the n⁻ layer 2a on the low voltage side.

In the event the semiconductor device used as an inverter or the like, the voltage at the electrode 24 for the high voltage side (VS voltage) changes due to switching. The voltage at the electrode 24 may become a negative voltage due to the parasitic inductance on wiring, etc. When the p⁻ substrate 1 and the n⁻ layer 2b are under a forward bias, the electrode 24 carries a current, holes flow into the n⁻ layer 2, and malfunction occurs.

In the semiconductor device 1400 according to the fourteenth embodiment, the n⁻ layer 2b, together with the p diffusion layer 9b, forms a pn diode. The pn diode becomes reversely biased upon development of a negative voltage at the electrode 24. Hence, a current will not flow until a voltage which breaks down this pn junction is reached, thereby preventing malfunction.

During a normal operation, a forward bias is applied upon the pn diode so that a current flows from the n-type region 18b to the low voltage section via the aluminum wire 13 and the n-type region 18a. In the semiconductor device 1400, since the trench isolation part (5b, 6b, 7b) isolates the n⁻ layers 2a and 2b from each other, no holes will flow into the n⁻ layer 2a during a normal operation and no malfunction will therefore occur.

As described above, in the semiconductor device 1400 according to the fourteenth embodiment, the series-connected diode is formed in the high breakdown voltage level shifter and the trench isolation structure (5b, 6b, 7b) prevents implantation of holes into the n⁻ layer 2a during the normal operation, and hence, even when the VS voltage becomes negative, it is possible to prevent the element from malfunctioning.

Although the fourteenth embodiment requires isolating the low-voltage region of the level shifter structure by one trench, multiple trenches may be formed as in the semiconductor device 800 according to the eighth embodiment described earlier or an island region may be disposed between the low voltage region and the logic circuit part as in the semiconductor device 1300 according to the thirteenth embodiment, which brings about multiple effects.

Fifteenth Embodiment

Figure 16A:
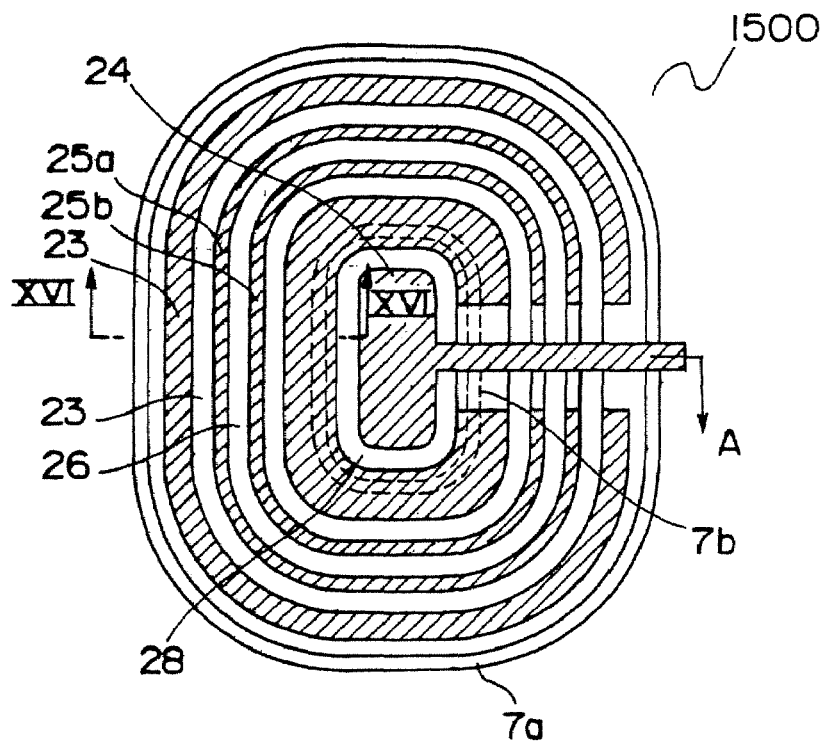
FIG. 16A shows a top view of a semiconductor device according to a fifteenth embodiment of the present invention.
Figure 16B:
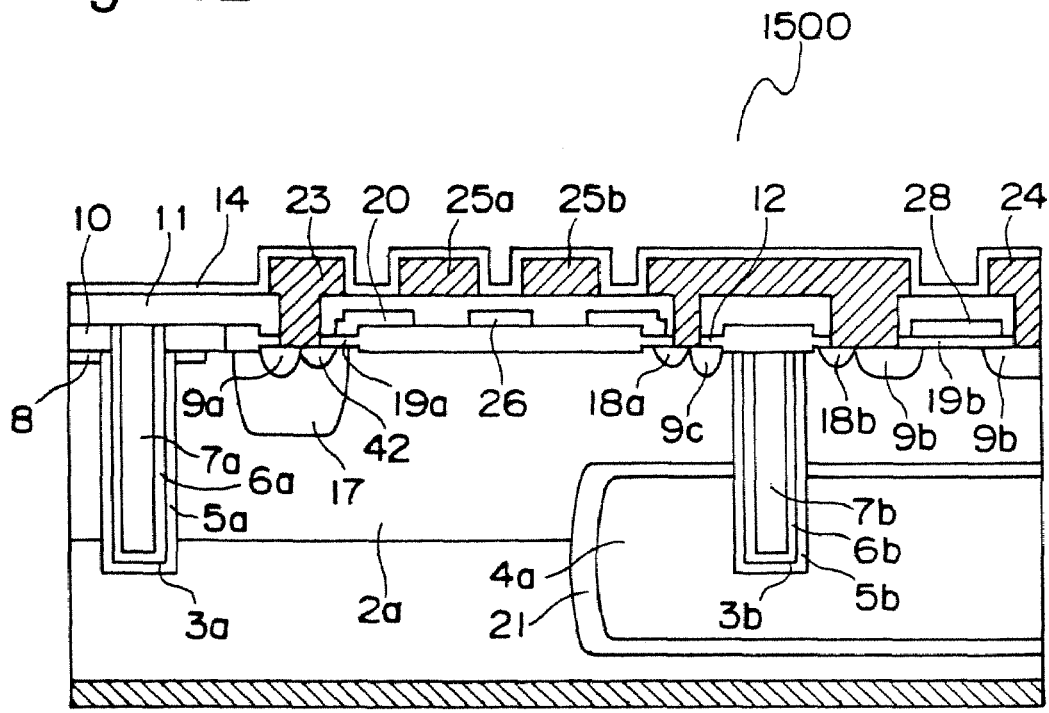
FIG. 16B shows a cross sectional view of a semiconductor device according to a fifteenth embodiment of the present invention.

FIGS. 16A and 16B show a semiconductor device according to the fifteenth embodiment of the present invention generally denoted at 1500. FIG. 16A is a top view, and FIG. 16B is a cross sectional view taken along the direction XVI-XVI in FIG. 16A. In FIGS. 16A and 16B, the same reference symbols as those appearing in FIGS. 9A and 9B denote the same or corresponding portions.

The semiconductor device 1500 has a structure which prevents malfunction of the high-voltage level shifter structure, with a P-ch MOSFET formed by p diffusion layers 9b and 9d, an gate oxide film 19b and a gate electrode 28 formed in the region A of in the semiconductor device 1400 according to the fourteenth embodiment.

In the semiconductor device 1500, the gate electrode 28 stays turned on and carries a current during a normal operation. Upon occurrence of abnormality, the voltage at the gate electrode 28 drops low and the gate electrode 28 turns off.

A basic operation at the time of malfunction is similar to that in the fourteenth embodiment. The diode between the n⁻ layer 2b and the p⁺ diffusion layer 9b, which contacts the electrode 24 for the high-voltage side, becomes reversely biased so that the n⁻ layer 2b will not carry a current and malfunction will be obviated.

On the contrary, during the normal operation, unlike in the fourteenth embodiment, a current flows through the P-ch MOSFET mentioned above instead of the diode. The P-ch MOSFET part functions as a resistor, and the level shifter as a whole realizes a MOS operation.

As described above, the series-connected diode is formed in the high breakdown voltage level shifter and the trench isolation structure (5b, 6b, 7b) prevents implantation of holes into the n⁻ layer 2a during the normal operation, which prevents the element from malfunctioning even when the VS voltage becomes negative.

Sixteenth Embodiment

Figure 17A:
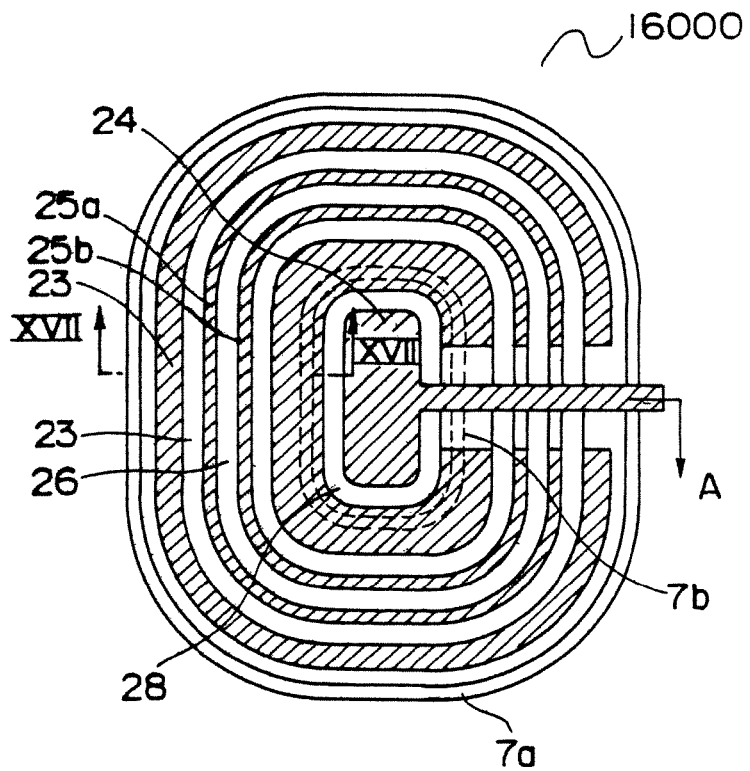
FIG. 17A shows a top view of a semiconductor device according to a sixteenth embodiment of the present invention.
Figure 17B:
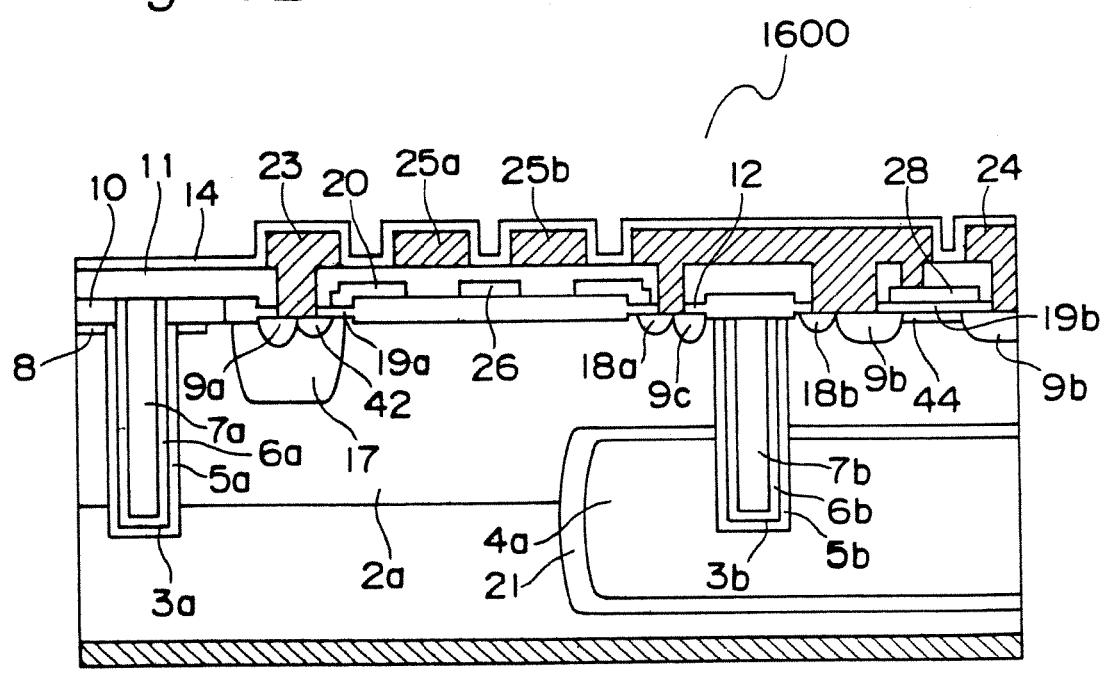
FIG. 17B shows a cross sectional view of a semiconductor device according to a sixteenth embodiment of the present invention.

FIGS. 17A and 17B show a semiconductor device according to the sixteenth embodiment of the present invention generally denoted at 1600. FIG. 17A is a top view, and FIG. 17B is a cross sectional view taken along the direction XVII-XVII in FIG. 17A. In FIGS. 17A and 17B, the same reference symbols as those appearing in FIGS. 9A and 9B denote the same or corresponding portions.

The semiconductor device 1600 is the same as the semiconductor device 1500 according to the fifteenth embodiment as it is modified such that the gate electrode 28 is connected with the common contact of the n⁺ diffusion layer 18b and the p⁺ diffusion layer 9d. If necessary, a buried channel layer 44 may be disposed. A P-ch MOSFET formed by the p⁺ diffusion layers 9b and 9d, a gate oxide film 19b and the gate electrode 28 normally remains turned on (normally ON), and a threshold value is adjusted so that the p-ch MOSFET turns off when the electrode 24 is negatively biased and a reverse bias is applied between the n⁻ layer 2b and the p diffusion layer 9b.

While the semiconductor device 1600 operates normally, the p-ch MOSFET carries a current. Since the P-ch MOSFET part functions as a resistor, and the level shifter as a whole realizes a MOS operation.

On the contrary, when the semiconductor device 1600 malfunctions, as in the fifteenth embodiment, the diode between the n⁻ layer 2b and the p⁺ diffusion layer 9b contacting the electrode 24 for the high voltage side becomes reversely biased so that the n⁻ layer 2b will not carry a current and malfunction will be obviated. A characteristic of the present invention is that the gate of the p-ch MOSFET turns off during an abnormal operation.

The structure that the series-connected diode is formed in the high breakdown voltage level shifter and the trench isolation structure (5b, 6b, 7b) prevents implantation of holes into the n⁻ layer 2a during the normal operation thus prevents malfunction when the VS voltage becomes a negative voltage.

Seventeenth Embodiment

Figure 18A:
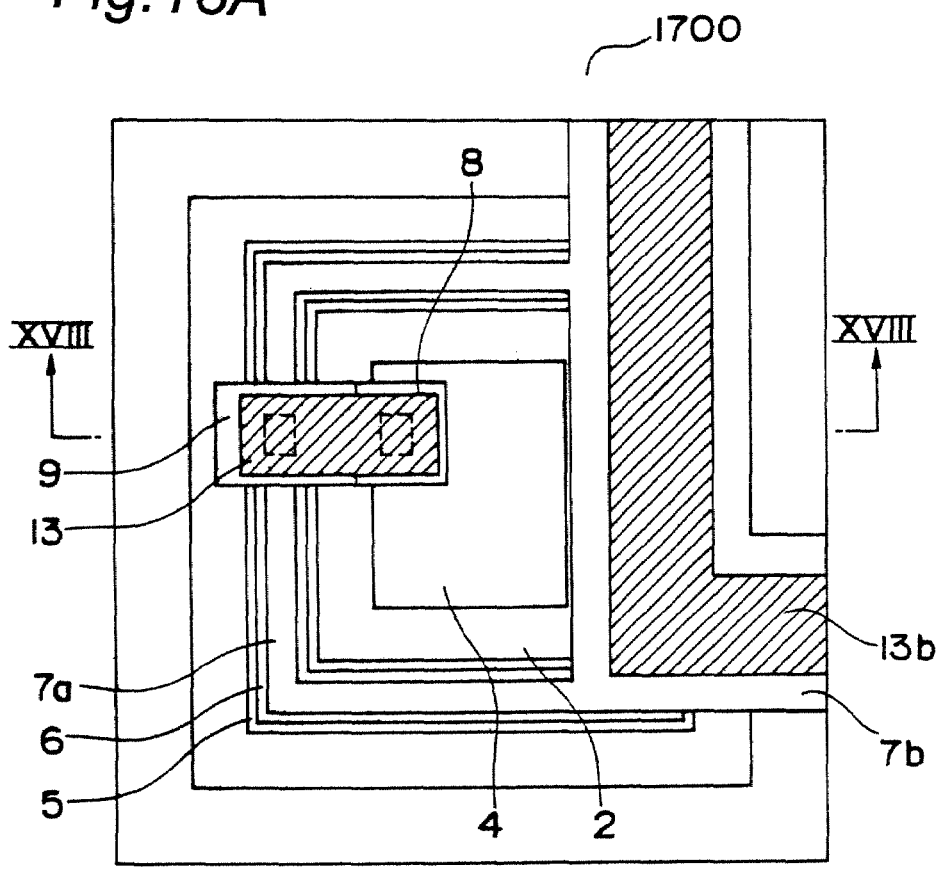
FIG. 18A shows a top view of a semiconductor device according to a seventeenth embodiment of the present invention.
Figure 18B:
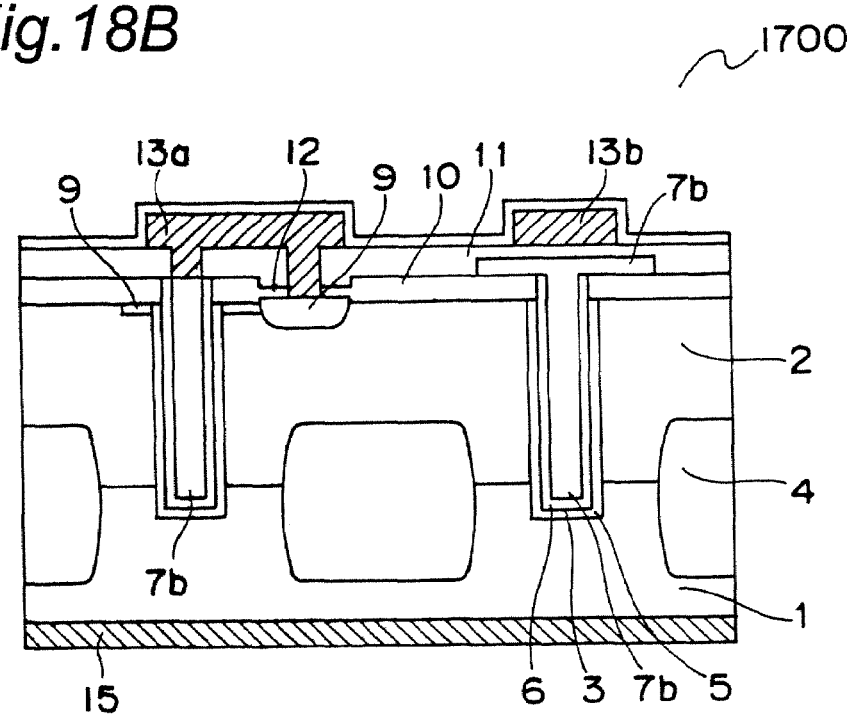
FIG. 18B shows a cross sectional view of a semiconductor device according to a seventeenth embodiment of the present invention.

FIGS. 18A and 18B show a semiconductor device according to the seventeenth embodiment of the present invention generally denoted at 1700. FIG. 18A is a top view, and FIG. 18B is a cross sectional view taken along the direction XVIII-XVIII in FIG. 18A. In FIGS. 18A and 18B, the same reference symbols as those appearing in FIGS. 9A and 9B denote the same or corresponding portions.

The semiconductor device 1700 has a structure which shuts off and reduces the influence exerted by upper wiring, using a trench isolation structure. While using the trench isolation structure (5, 6, 7) as in the first embodiment described earlier, the semiconductor device 1700 uses an extension area which is an upper portion of the buried conductor 7 buried in the trench 3 extending out on the field oxide film such that the buried conductor has a T-shaped cross section (FIG. 18B). The extension area seats the wiring 13b via the inter-layer insulation film 11.

If wiring is provided on a substrate area whose surface concentration is low, the influence exerted by a voltage at the wiring or the like will result in an adverse effect such as inversion at the substrate surface (the n⁻ layer 2, etc.). An approach to prevent such an adverse effect may be use of a conductor having a fixed voltage (which may be GND for instance) which shuts off between the two.

The seventeenth embodiment, using a shut-off structure which shuts off between the wiring 13b and the n⁻ layer 2 by means of a part of the conductor inside the trench, suppresses the influence of the wiring 13b over the substrate surface and prevents the semiconductor device 1700 from malfunctioning.

The isolation structure using the trench isolation structure (5, 6, 7) thus serves also as the shut-off structure which prevents the wiring 13 from affecting the substrate surface, whereby the chip area size is reduced and malfunction of the element is obviated.

Eighteenth Embodiment

Figure 19A:
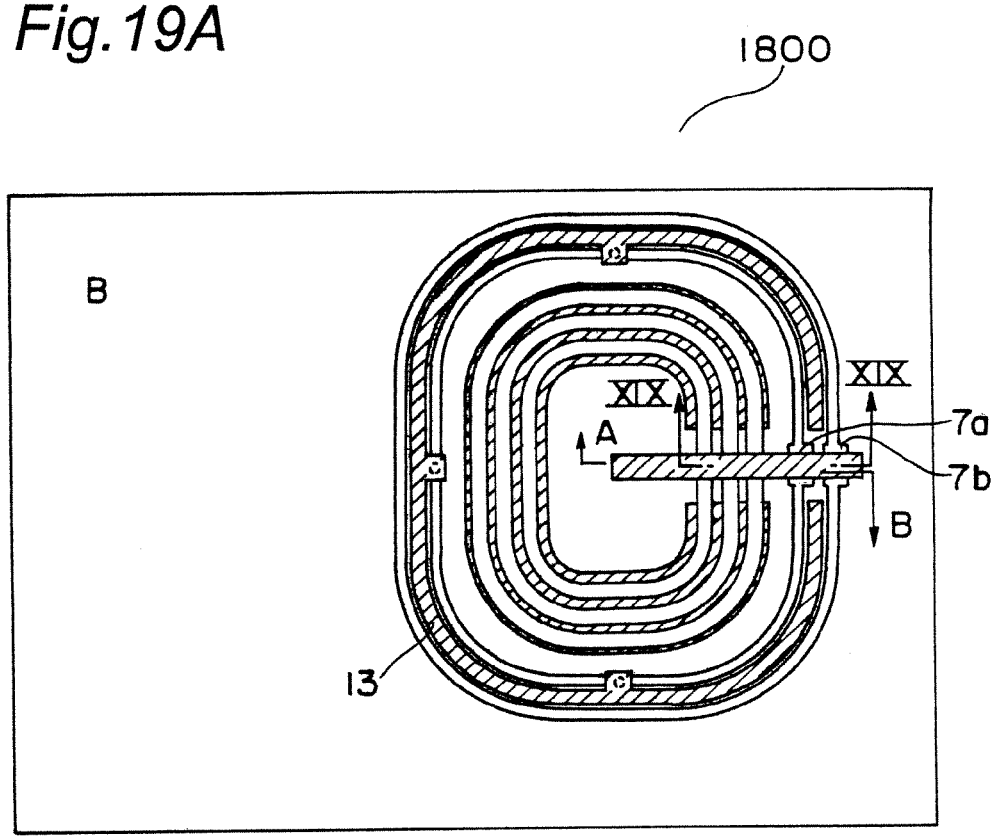
FIG. 19A shows a top view of a semiconductor device according to an eighteenth embodiment of the present invention.
Figure 19B:
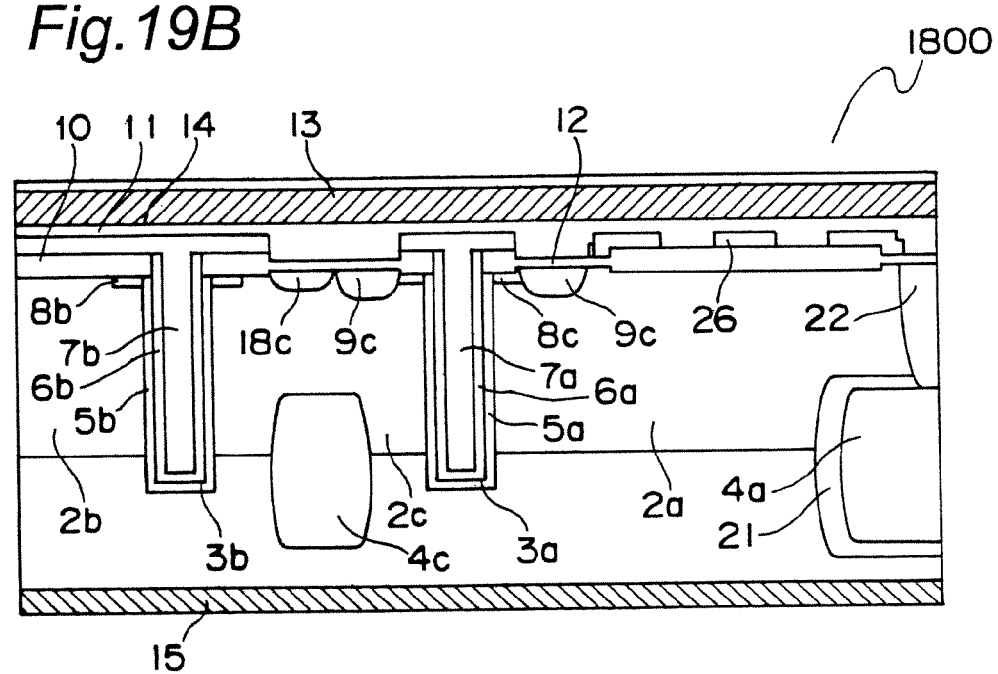
FIG. 19B shows a cross sectional view of a semiconductor device according to an eighteenth embodiment of the present invention.
Figure 20:
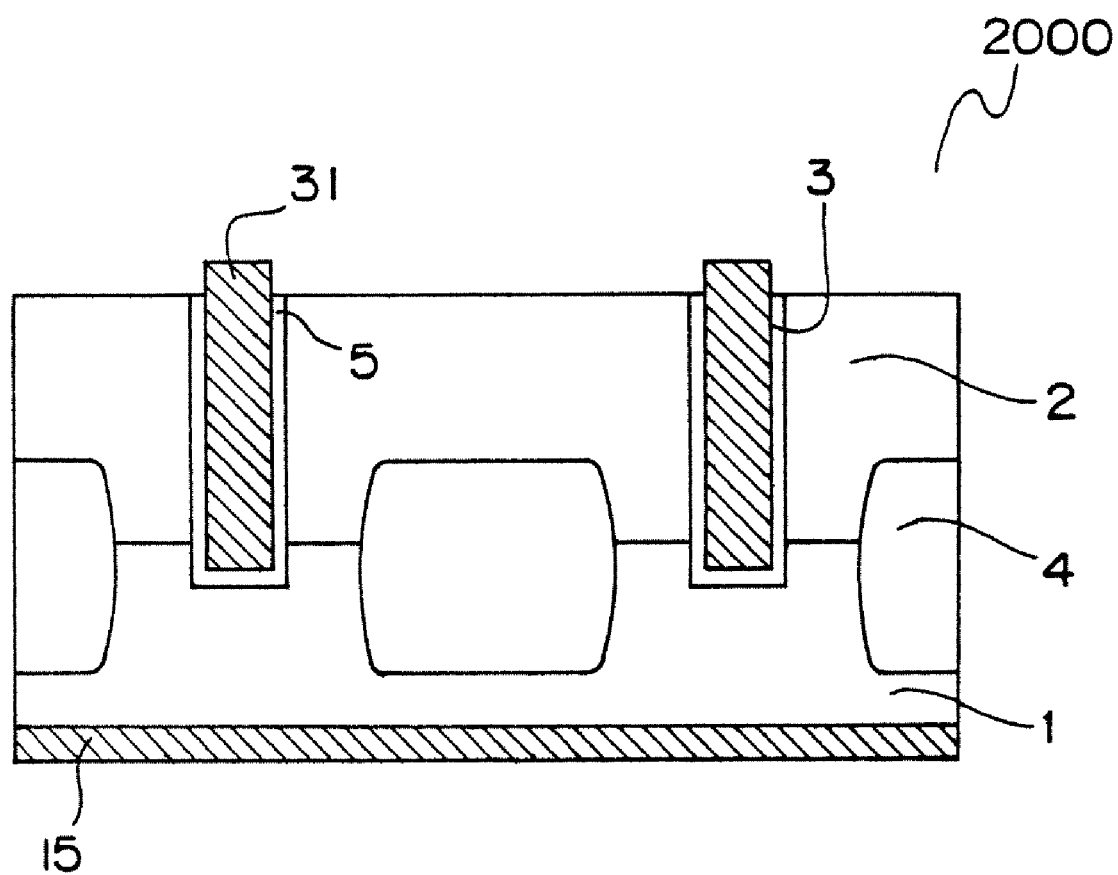
FIG. 20 is a cross sectional view of a conventional semiconductor device.

FIGS. 19A and 19B show a semiconductor device according to the eighteenth embodiment of the present invention generally denoted at 1800. FIG. 19A is a top view, and FIG. 19B is a cross sectional view taken along the direction XIX-XIX in FIG. 19A. In FIGS. 19A and 19B, the same reference symbols as those appearing in FIGS. 9A and 9B denote the same or corresponding portions.

The semiconductor device 1800 is application of a shut-off structure which serves also as a trench structure to the semiconductor device 1300 according to the thirteenth embodiment.

As shown in FIGS. 19A and 19B, in this structure, for the purpose of preventing the high-voltage wiring 13 from influencing the circuit part (region B), the hFE lowering structure (region C) and the like, the upper section of the trench conductor 7 has a T-shaped extension area, thereby forming the shut-off structure, on top of the thirteenth embodiment.

The isolation structure using the trench isolation structure (5, 6, 7) thus serves also as the shut-off structure which prevents the wiring 13 from affecting the circuit part (region B), the hFE lowering structure (region C) and the like, whereby the chip area size is reduced and malfunction of the element is obviated.

In the embodiments described above, the associated semiconductor devices may be fabricated replacing the p-type and the n-type with each other.

What is claimed is:

1. A semiconductor device, comprising:
   a semiconductor substrate of a first conductivity type;
   a semiconductor layer of a second conductivity type formed on said semiconductor substrate;
   a trench formed in said semiconductor layer;
   a trench diffusion layer of the first conductivity type formed along wall surfaces of said trench;
   a buried conductor buried in said trench;
   a first diffusion layer of the first conductivity type formed in said semiconductor layer around an opening of said trench;
   a second diffusion layer of the first conductivity type formed along said trench diffusion layer which is in the vicinity of the opening of said trench; and
   a front electrode formed on the buried conductor, wherein
   an insulation film is further disposed between said wall surfaces of said trench and said buried conductor, and wherein
   said buried conductor is electrically connected with said trench diffusion layer via the first diffusion layer, the second diffusion layer, and the front electrode.

2. The semiconductor device according to claim 1, wherein said trench is disposed reaching said semiconductor substrate.

3. The semiconductor device according to claim 1, comprising a buried layer of the second conductivity type disposed locally between said semiconductor substrate and said semiconductor layer, wherein
   said trench is shallower than the film thickness of said semiconductor layer but reaches said buried layer.

4. The semiconductor device according to claim 3, wherein within said semiconductor layer including a level shifter circuit portion,
   a high-voltage part of said level shifter circuit portion has a drain of the first conductivity type, said high-voltage part and said semiconductor layer of the second conductivity type form a diode, and said trench is formed surrounding said drain of the first conductivity type.

5. The semiconductor device according to claim 4, wherein a MOSFET including said drain, a source of the first conductivity type and a gate is formed within said semiconductor layer which is surrounded by said trench.

6. The semiconductor device according to claim 5, wherein said MOSFET is designed to normally remain turned on and have such a threshold value in accordance with which said MOSFET turns off upon occurrence of abnormality that an electric potential at said semiconductor layer which is surrounded by said trench increases.

7. The semiconductor device according to claim 1, wherein the first conductivity type impurity concentration of said first diffusion layer is lower than the first conductivity type impurity concentration of said trench diffusion layer.

8. The semiconductor device of claim 7, wherein said trench has, within the surface of said semiconductor layer, an approximately rectangular shape which bends approximately at a right angle in corner sections, and said first diffusion layer is disposed around said corner sections.

9. The semiconductor device according to claim 8, wherein there is a semiconductor element in an area surrounded by said trench.

10. The semiconductor device according to claim 1, wherein the first conductivity type impurity concentration of said second diffusion layer is lower than the first conductivity type impurity concentration of said trench diffusion layer.

11. The semiconductor device according to claim 1, wherein said trench has, within the surface of said semiconductor layer, a polygonal shape having corner sections whose inner angle exceeds 90 degrees.

12. The semiconductor device according to claim 1, wherein said trench has, within the surface of said semiconductor layer, a shape having arc-like corner sections.

13. The semiconductor device according to claim 1, wherein multiple such trenches are formed surrounding an isolation region within the surface of said semiconductor layer,
   a second diffusion layer of the first conductivity type is formed along said trench diffusion layer which is in the vicinity of the opening of the outer-most trench, and
   the first conductivity type impurity concentration of said second diffusion layer is lower than the first conductivity type impurity concentration of said trench diffusion layer.

14. The semiconductor device according to claim 1, comprising a buried layer of the second conductivity type disposed locally between said semiconductor substrate and said semiconductor layer and a circuit portion formed above said buried layer between said semiconductor substrate and said semiconductor layer, wherein
   said trench is formed surrounding said semiconductor element and reaching said buried layer, and
   said trench diffusion layer and said buried conductor are connected with an area of the second conductivity type which is contained within said circuit portion.

15. The semiconductor device according to claim 1, wherein such trenches are formed, one at the inner circumference and the other at the outer circumference, in such a manner that said trenches surround an isolation region within the surface of said semiconductor layer, and
   a high-voltage circuit portion or a level shifter circuit portion is disposed in said isolation region surrounded by the inner trench, a low-voltage logic circuit portion is disposed outside the outer trench, and an area of the second conductivity type surrounded by the inner trench and the outer trench is electrically connected with said trench diffusion layer at the outer circumference which is disposed inside said isolation region.

16. The semiconductor device according to claim 1, wherein an upper section of said buried conductor includes an extension area which extends out covering the top of said trench diffusion layer.

* * * * *